US00RE39227E

(19) United States
(12) Reissued Patent
Lien et al.

(10) Patent Number: US RE39,227 E
(45) Date of Reissued Patent: Aug. 8, 2006

(54) CONTENT ADDRESSABLE MEMORY (CAM) ARRAYS AND CELLS HAVING LOW POWER REQUIREMENTS

(75) Inventors: Chuen-Der Lien, Los Altos Hills, CA (US); Chau-Chin Wu, Cupertino, CA (US)

(73) Assignee: Integrated Device Technology, Inc., San Jose, CA (US)

(21) Appl. No.: 10/403,581

(22) Filed: Mar. 31, 2003

Related U.S. Patent Documents

Reissue of:
(64) Patent No.: 6,128,207
Issued: Oct. 3, 2000
Appl. No.: 09/185,057
Filed: Nov. 2, 1998

U.S. Applications:
(62) Division of application No. 10/246,586, filed on Sep. 18, 2002, now abandoned.

(51) Int. Cl.
*G11C 15/00* (2006.01)

(52) U.S. Cl. ..... 365/49; 365/156; 365/189.07; 365/190

(58) Field of Classification Search ..... 365/49, 365/156, 189.07, 190
See application file for complete search history.

(56) References Cited

U.S. PATENT DOCUMENTS 4,377,855 A * 3/1983 Lavi ..... 365/49
4,559,618 A * 12/1985 Houseman et al. ..... 365/49
4,646,271 A * 2/1987 Uchiyama et al. ..... 365/49
4,694,425 A * 9/1987 Imel ..... 365/49
4,723,224 A * 2/1988 Van Hulett et al. ..... 365/49
4,780,845 A 10/1988 Threewitt
5,051,948 A 9/1991 Watabe et al.
5,051,949 A 9/1991 Young
5,111,427 A 5/1992 Kobayashi et al.
5,258,946 A 11/1993 Graf
5,319,589 A 6/1994 Yamagata et al.
5,351,208 A * 9/1994 Jiang ..... 365/49
5,406,508 A 4/1995 Hayashibara
5,440,709 A * 8/1995 Edgar ..... 711/1
5,446,685 A 8/1995 Holst
5,515,310 A 5/1996 Winters
5,598,115 A 1/1997 Holst (Continued)

OTHER PUBLICATIONS

U.S. Appl. No. 10/106,420, filed Mar. 26, 2002.

*Primary Examiner*—Hoai Ho
(74) *Attorney, Agent, or Firm*—Myers Bigel Sibley & Sajovec PA

(57) ABSTRACT

A content addressable memory (CAM) cell that includes a static random access memory (SRAM) cell that operates in response to a $V_{CC}$ supply voltage. A first set of bit lines coupled to the SRAM cell are used to transfer data values to and from the SRAM cell. The signals transmitted on the first set of bit lines have a signal swing equal to the $V_{CC}$ supply voltage. A second set of bit lines is coupled to receive a comparison data value. The signals transmitted on the second set of bit lines have a signal swing that is less than the $V_{CC}$ supply voltage. For example, the signal swing on the second set of bit lines can be as low as two transistor threshold voltages. The second set of bit lines is biased with a supply voltage that is less than the $V_{CC}$ supply voltage. A sensor circuit is provided for comparing the data value stored in the CAM cell with the comparison data value. The sensor circuit pre-charges a match scan line prior to a compare operation. If the data value stored in the CAM cell does not match the comparison data value, the match sense line is pulled down. The signal swing of the match sense line is smaller than the $V_{CC}$ supply voltage. For example, the signal swing on the match sense line can be as low as one transistor threshold voltage.

68 Claims, 14 Drawing Sheets

U.S. PATENT DOCUMENTS

| | | | | | |
|---|---|---|---|---|---|
| 5,642,320 | A | | 6/1997 | Jang | |
| 5,699,288 | A | * | 12/1997 | Kim et al. | 365/49 |
| 5,715,188 | A | * | 2/1998 | Covino et al. | 365/49 |
| 5,852,569 | A | | 12/1998 | Srinivasan et al. | |
| 5,859,791 | A | * | 1/1999 | Schultz et al. | 365/49 |
| 5,949,696 | A | | 9/1999 | Threewitt | |
| 6,044,005 | A | | 3/2000 | Gibson et al. | |
| 6,157,557 | A | | 12/2000 | Lee et al. | |
| 6,181,591 | B1 | | 1/2001 | Miyatake et al. | |
| 6,195,278 | B1 | | 2/2001 | Calin et al. | |
| 6,266,262 | B1 | | 7/2001 | Washburn et al. | |
| 6,288,922 | B1 | | 9/2001 | Wong et al. | |
| 6,373,738 | B1 | | 4/2002 | Towler et al. | |

* cited by examiner

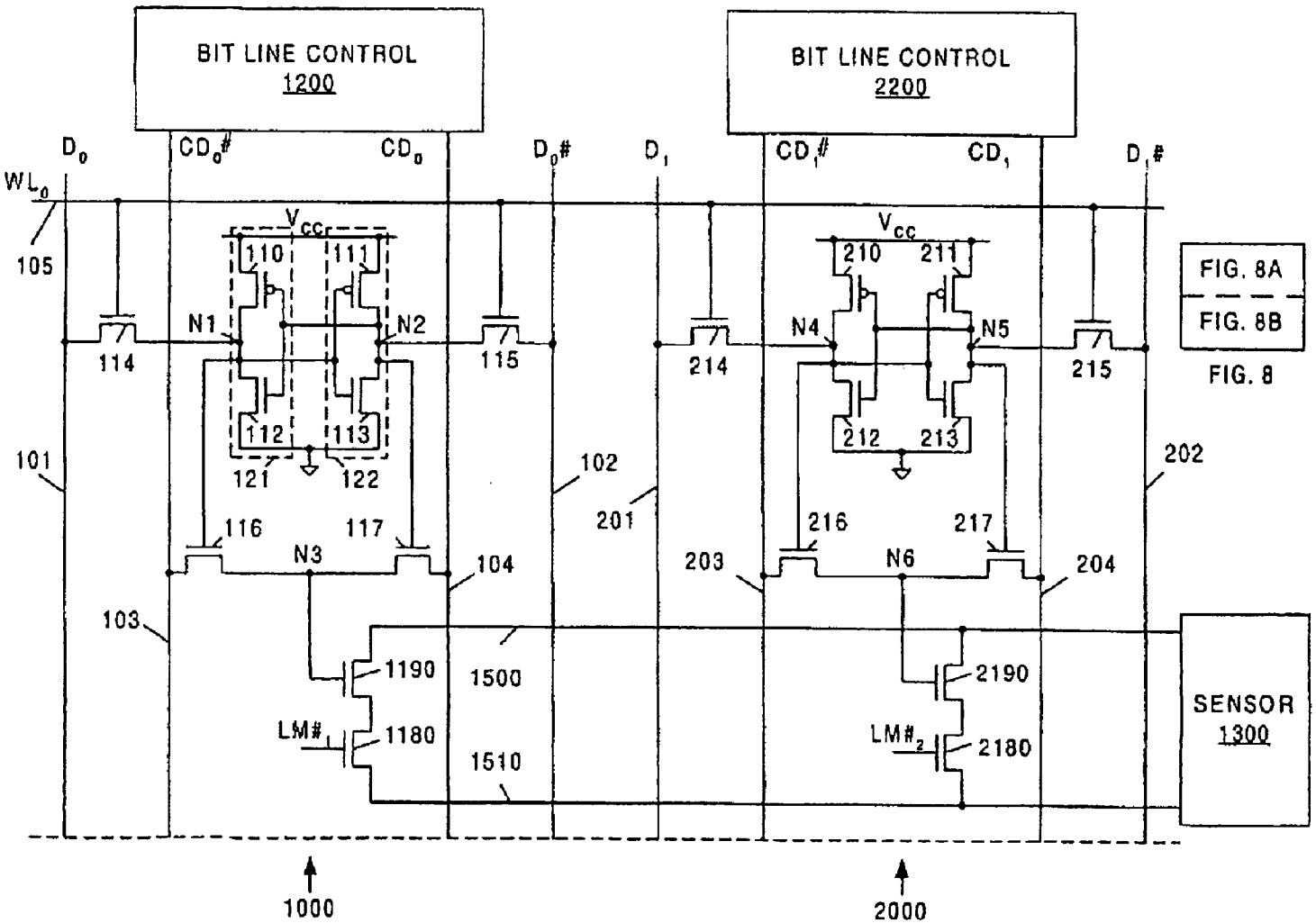
FIG. 8A
Amended

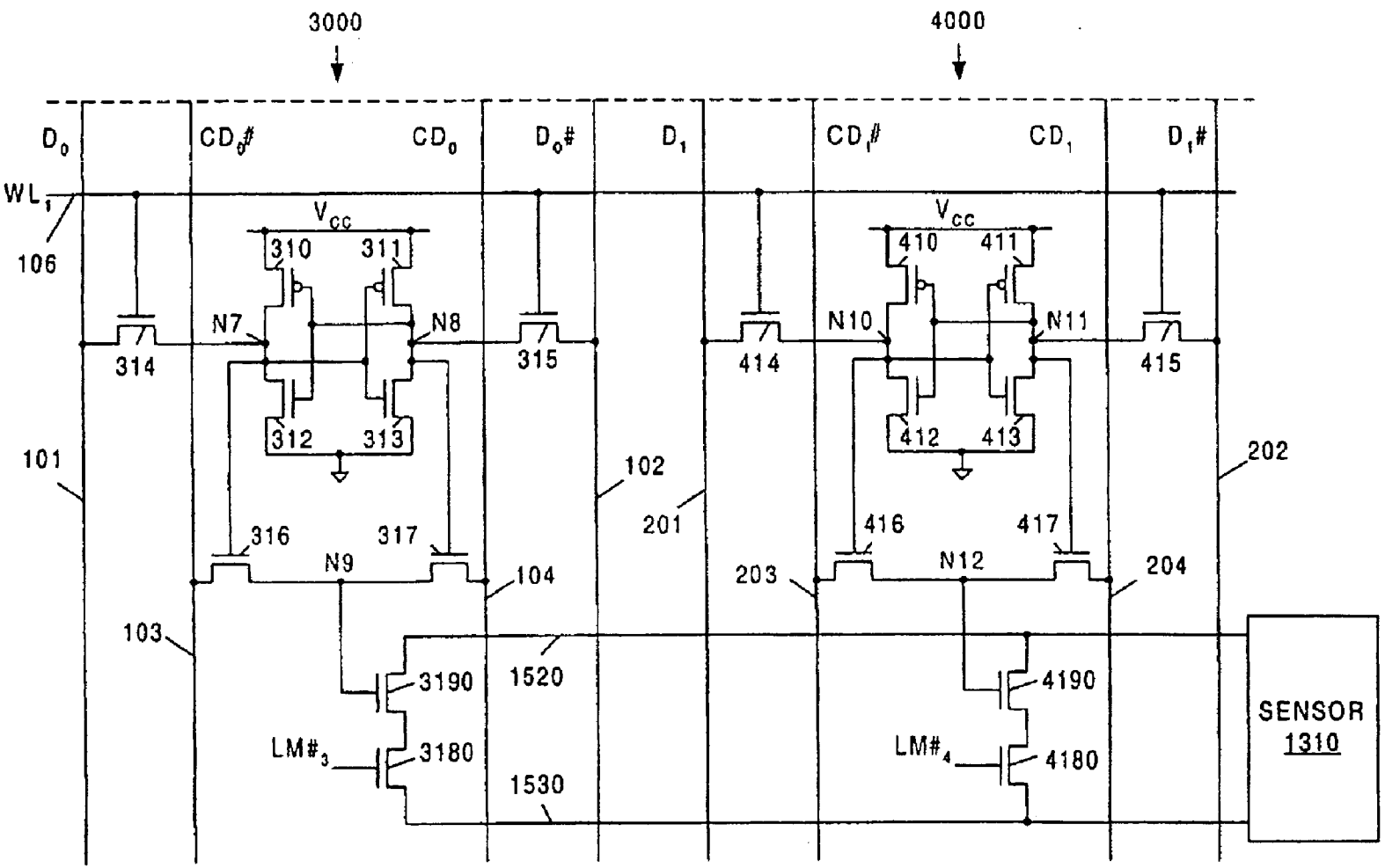
FIG. 8B
Amended

CONTENT ADDRESSABLE MEMORY (CAM) ARRAYS AND CELLS HAVING LOW POWER REQUIREMENTS

Matter enclosed in heavy brackets [ ] appears in the original patent but forms no part of this reissue specification; matter printed in italics indicates the additions made by reissue.

*This application is a divisional of U.S. application Ser. No. 10/246,586, filed Sep. 18, 2002, now abandoned, which is a reissue of U.S. application Ser. No. 09/185,057, filed Nov. 2, 1998, now U.S. Pat. No. 6,128,207.*

BACKGROUND OF THE INVENTION

1. Field of the Invention

The present invention relates to content addressable memory (CAM) cells. More specifically, the present invention relates to nine transistor CAM cells and methods for operating these cells in an array.

2. Discussion of Related Art

CAM cells are defined as memory cells that are addressed in response to their content, rather than by a physical address within an array. FIG. 1 is a block diagram of a conventional memory array formed using twelve CAM cells. The CAM cells are labeled $M_{X,Y}$, where X is the row of the array, and Y is the column of the array. Thus, the array includes CAM cells $M_{0,0}$ to $M_{2,3}$. Each of the CAM cells is programmed to store a data value. In the described example, the data value stored in each CAM cell is indicated by either a "0" or a "1" in brackets. For example, CAM cells $M_{0,0}$, $M_{0,1}$, $M_{0,2}$ and $M_{0,3}$ store data values of 0, 1, 0 and 0, respectively. Each row of CAM cells is coupled to a common match line. For example, CAM cells $M_{0,0}$, $M_{0,1}$, $M_{0,2}$ and $M_{0,3}$ are coupled to match line $MATCH_0$.

The array of CAM cells is addressed by providing a data value to each column of CAM cells. Thus data values $D_0$, $D_1$, $D_2$ and $D_3$ are provided to columns 0, 1, 2 and 3, respectively. Note that complementary data values $D_0$#, $D_1$#, $D_2$# and $D_3$# are also provided to columns 0, 1, 2 and 3, respectively. If the data values stored in a row of the CAM cells match the applied data values $D_0$–$D_3$, then a match condition occurs. For example, if the data values $D_0$, $D_1$, $D_2$ and $D_3$ are 0, 1, 0 and 0, respectively, then the data values stored in the CAM cells of row 0 match the applied data values. Under these conditions, the MATCHo signal is asserted high. Because the applied data values $D_0$, $D_1$, $D_2$ and $D_3$ do not match the data values store in the CAM cells of rows 1 or 2, the $MATCH_1$ and $MATCH_2$ signals are de-asserted low. The match signals $Match_0$–$MATCH_2$ can be used for various purposes, such as implementing virtual addressing, in a manner (known to those skilled in the art.

Many different types of CAM cells have been designed. Important considerations in the design of a CAM cell include: the number of transistors required to implement the cell, the power required to operate the CAM cell, and the speed of the CAM cell. In general, it is desirable to have a CAM cell that is implemented using a relatively small number of transistors, such that the layout area of the CAM cell is minimized. It is also desirable for the CAM cell to have a low power requirement and a fast operating speed.

FIG. 2 is a circuit diagram of a conventional nine tune transistor (9-T) CAM cell 10. CAM cell 10 is described in detail in U.S. Pat. No. 4,723,224. CAM cell 10 includes a conventional static random access memory (SRAM) cell 12 and as exclusive OR (XOR) gate 14. SRAM cell 12 includes access transistors 20 and 22, and cross-coupled inverters 16 and 18. Access transistors 20 and 22 are coupled to word line 28 and bit lines 24 and 26, as illustrated. Driver circuitry 36 provides a data value (D) and the inverse of the data value (D#) to bit lines 24 and 26, respectively, during write and compare operations.

SRAM cell 12 is written like a conventional SRAM cell. That is, a logic high value is applied to word line 28, and data values D and D# are applied to bit lines 24 and 26, respectively. As a result, the data values D and D# are latched by inverters 16 and 18, such that the data value D is provided as the output of inverter 18, and the inverted data value D# is provided at the output of inverter 16.

XOR gate 14 includes n-channel transistors 30 and 32, which are connected in series between bit lines 24 and 26. The output terminal of inverter 16 is connected to the gate of transistor 30, such that the inverted data value D# stored in SRAM cell 12 is provided to the gate of transistor 30. Similarly, the output terminal of inverter 18 is connected to the gate of transistor 32, such that the data value D stored in SRAM cell 12 is provided to the gate of transistor 30. Transistors 30 and 32 are commonly connected at node 34, which forms the output terminal of XOR gate 14. Node 34 is connected to the gate of n-channel transistor 38. Transistor 38 has a source coupled to ground line 42, and a drain coupled to match line 40.

CAM cell 10 performs a compare operation as follows. Driver circuitry 36 applies a comparison data value (C) and its complement (C#) to bit lines 24 and 26, respectively. If the comparison data value C matches the data value D stored in SRAM cell 12, then node 34 is connected to receive a logic "0" signal. As a result, transistor 38 is turned off, thereby isolating match line 40 from ground line 42. Under these conditions, match line 40 retains a pre-charged logic high value.

Conversely, if the comparison data value C does not match the data value D stored in SRAM cell 12, then node 34 is connected to receive a logic "1" signal. As a result, transistor 38 is turned on, thereby coupling match line 40 to ground line 42. Under these conditions, match line 40 is pulled down toward ground.

CAM cell 10 exhibits relatively high power consumption because the same driver circuitry 36 is used to supply the write data values as well as the comparison data values. Driver circuitry 36 is powered by the $V_{CC}$ supply voltage, such that both the write and comparison data values have logic high values of $V_{CC}$. Moreover, the compare operation of CAM cell 10 is relatively slow because the capacitance of SRAM cell 12 is coupled to bit lines 24 and 26 during the compare operation.

It would therefore be desirable to have an improved CAM cell which allows a compare operation to be carried out using a supply voltage less than the $V_{CC}$ supply voltage. It would also be desirable for the improved CAM cell to have bit lines that are not coupled to the capacitance introduced by an SRAM cell during a compare operation. It would also be desirable for the improved CAM cell to be implemented using fewer transistors than conventional CAM cell 10. It would further be desirable for the improved CAM cell to have global and local masking capabilities.

SUMMARY

Accordingly, the present invention provides a CAM cell that implements a match line having a signal swing equal to one transistor threshold voltage, or about 0.3 Volts. The operating power of the CAM cell of the present invention is relatively low because the match line only undergoes a small voltage swing during a compare operation.

A CAM in accordance with the present invention includes an SRAM cell that operates in response to a $V_{CC}$ supply voltage. One or more read/write bit lines are coupled to the SRAM cell, thereby allowing read and write data values to be transferred to and from the SRAM cell. The $V_{CC}$ and ground voltage supplies provide signals to the read/write bit lines. That is, the signals applied to the read/write bit lines vary between a high voltage of $V_{CC}$ and a low voltage of 0 Volts.

One or more comparison bit lines are coupled to receive a comparison data value. The signals transmitted on the comparison bit lines have a signal swing that is less than the $V_{CC}$ supply voltage. In one embodiment, the signal swing on the comparison bit lines is equal to two times the transistor threshold voltage. Thus, if the transistor threshold voltage is equal to 0.3 Volts, then the signal swing on the comparison bit lines is equal to 0.6 Volts. Because the comparison bit lines are not directly connected to the SRAM cell, the capacitance of the SRAM cell is advantageously not coupled to the comparison bit lines. This improves both operating speed and power consumption of the CAM cell.

Moreover, the signals transmitted on the comparison bit lines are generated by a bit line control circuit that is powered in response to a supply voltage $V_{CC1}$ that is significantly lower than the $V_{CC}$ supply voltage. In one embodiment, the supply voltage $V_{CC1}$ can have a value as low as 0.9 Volts. By lowering the supply voltage required to perform a compare operation, the power of operating the CAM is advantageously reduced.

A sensor circuit is provided for comparing the data value stored in the CAM cell with the comparison data value provided on the comparison bit lines. The sensor circuit pre-charges the match line prior to a compare operation. If the data value stored in the CAM cell does not match the comparison data value, the match line is pulled down. The signal swing of the match line is smaller than the $V_{CC}$ supply voltage. In one embodiment, the signal swing on the match line is equal to transistor threshold voltage, or 0.3 Volts.

The sensor circuit monitors the voltage on the match line to determine whether the comparison data value matches the data value stored in the CAM cell (a match condition), or whether the comparison data value fails to match the data value stored in the CAM cell (a no-match condition). The sensor circuit converts the small swing signal on the match line to a large swing output signal. This output signal has a signal swing equal to the $V_{CC}$ supply voltage.

In one embodiment of the invention, a bit line control circuit is provided to control the voltages on the comparison bit lines. The bit line control circuit equalizes the voltages on the comparison bit lines to an intermediate voltage prior to each compare operation. As a result, less power is consumed during the compare operation. In one embodiment the intermediate voltage is equal to a transistor threshold voltage (e.g., 0.3 Volts).

The present invention will be more fully understood in view of the following description and drawings.

BRIEF DESCRIPTION OF THE DRAWINGS

FIG. 8, which consists of FIGS. 8A and 8B as illustrated, is a schematic diagram of a 2×2 array of nine-transistor CAM cells in accordance with another embodiment of the present invention;

DETAILED DESCRIPTION

Figure 1:
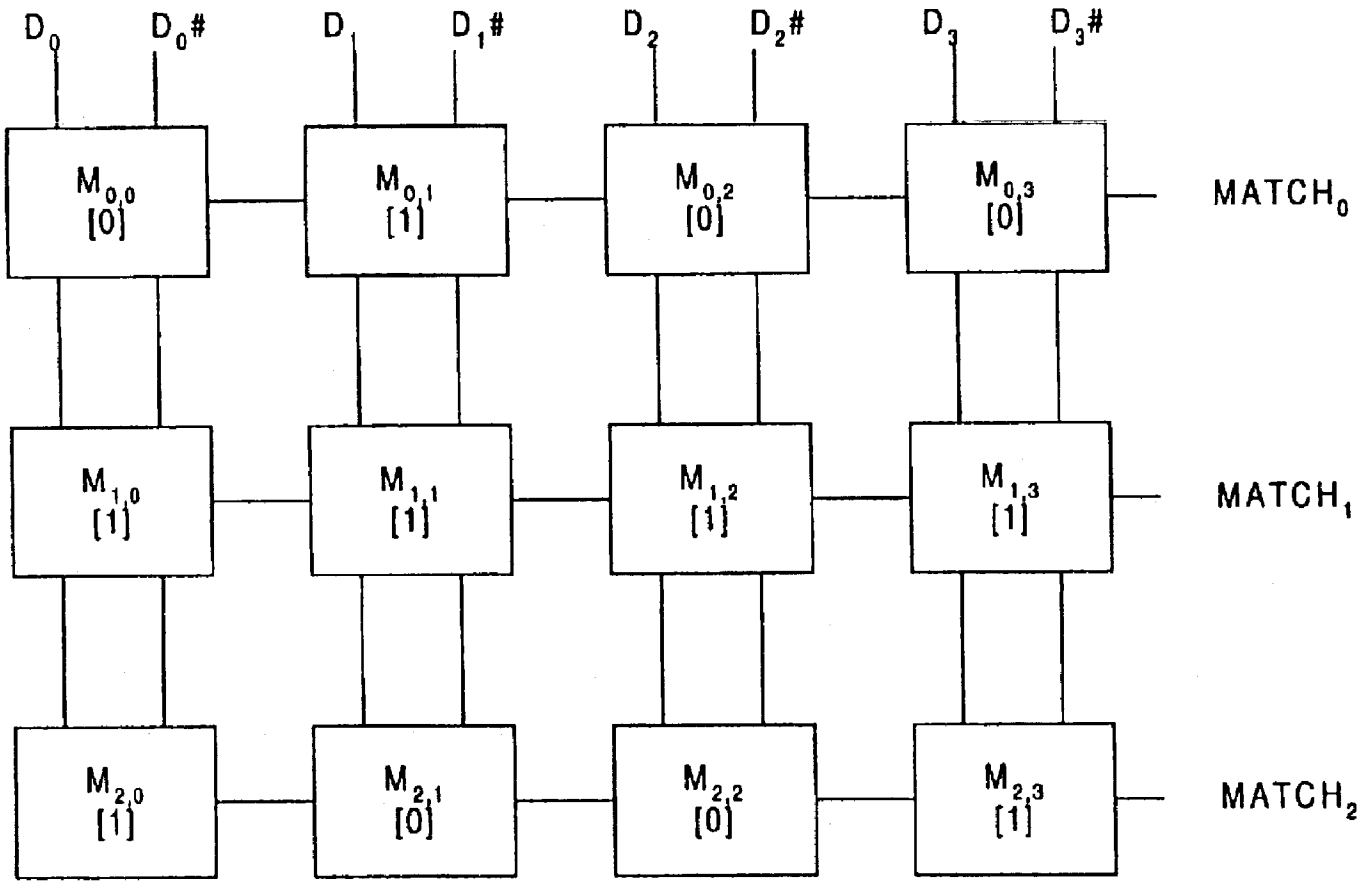
FIG. 1 (PRIOR ART)
FIG. 1 is a block diagram of a conventional array of CAM cells.
Figure 2:
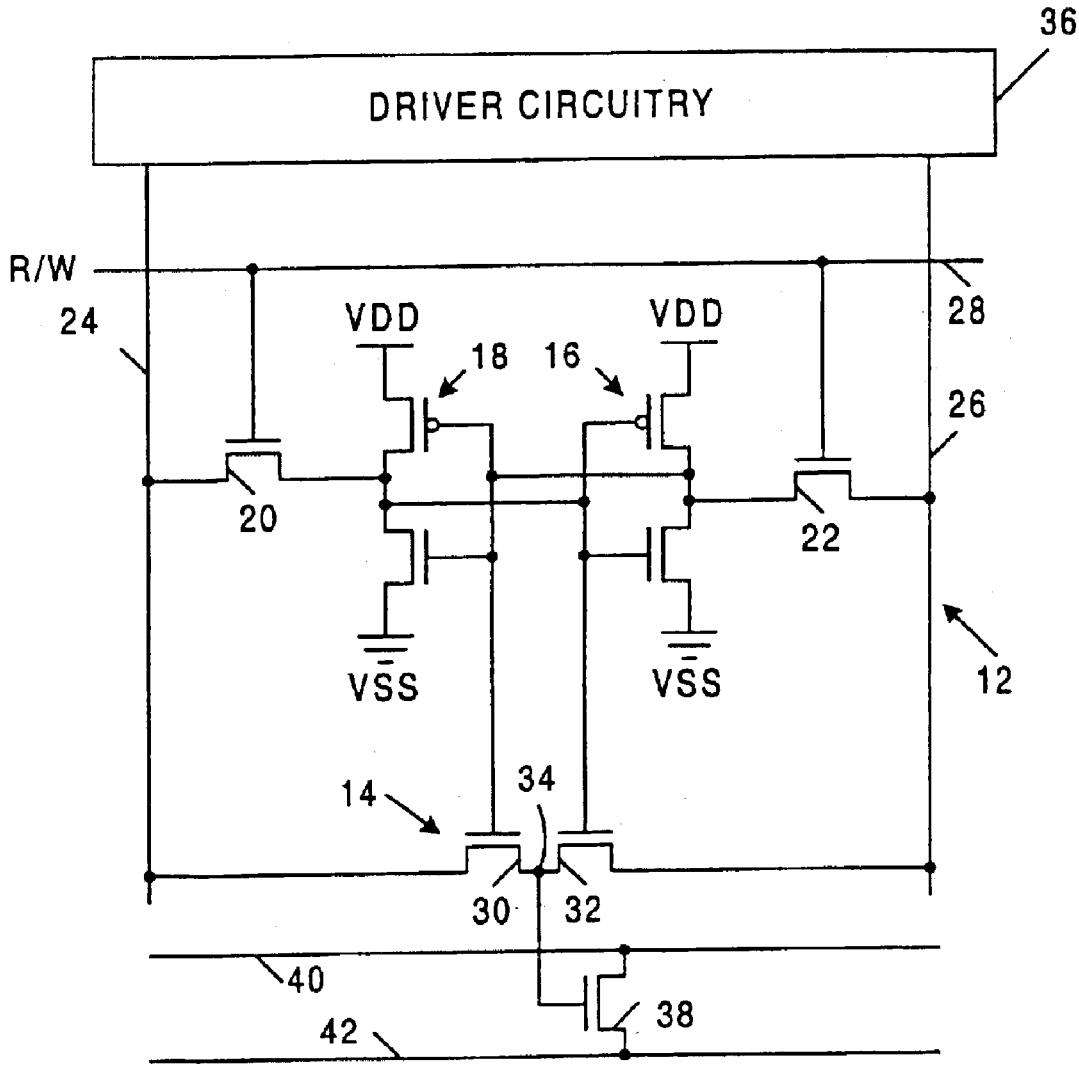
FIG. 2 (PRIOR ART)
FIG. 2 is a circuit diagram of a conventional nine transistor CAM cell.
Figure 3A:
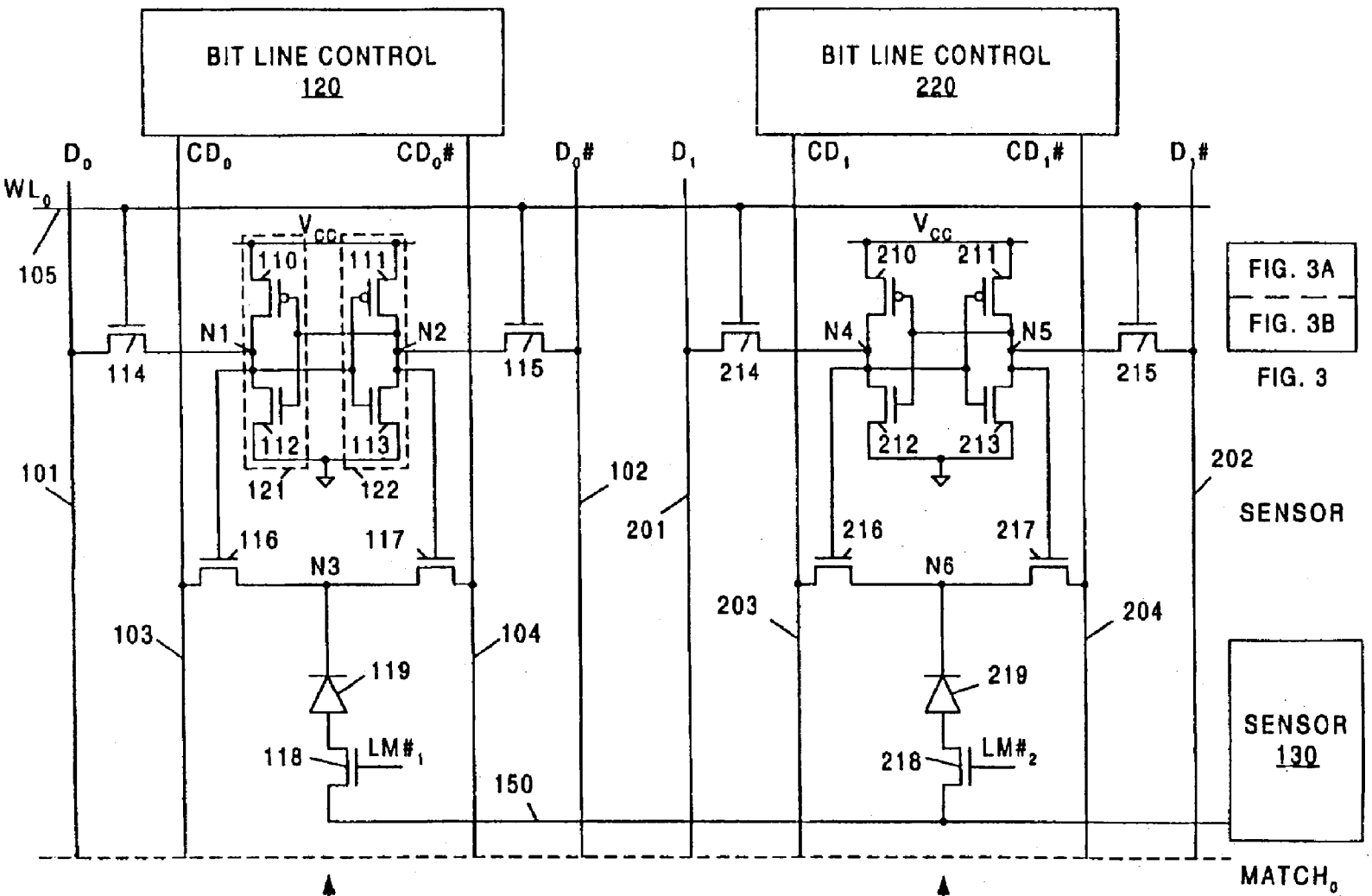
FIG. 3, which consists of FIGS. 3A and 3B as illustrated, is a schematic diagram of a 2×2 array of nine-transistor CAM cells in accordance with one embodiment of the present invention.
Figure 3B:
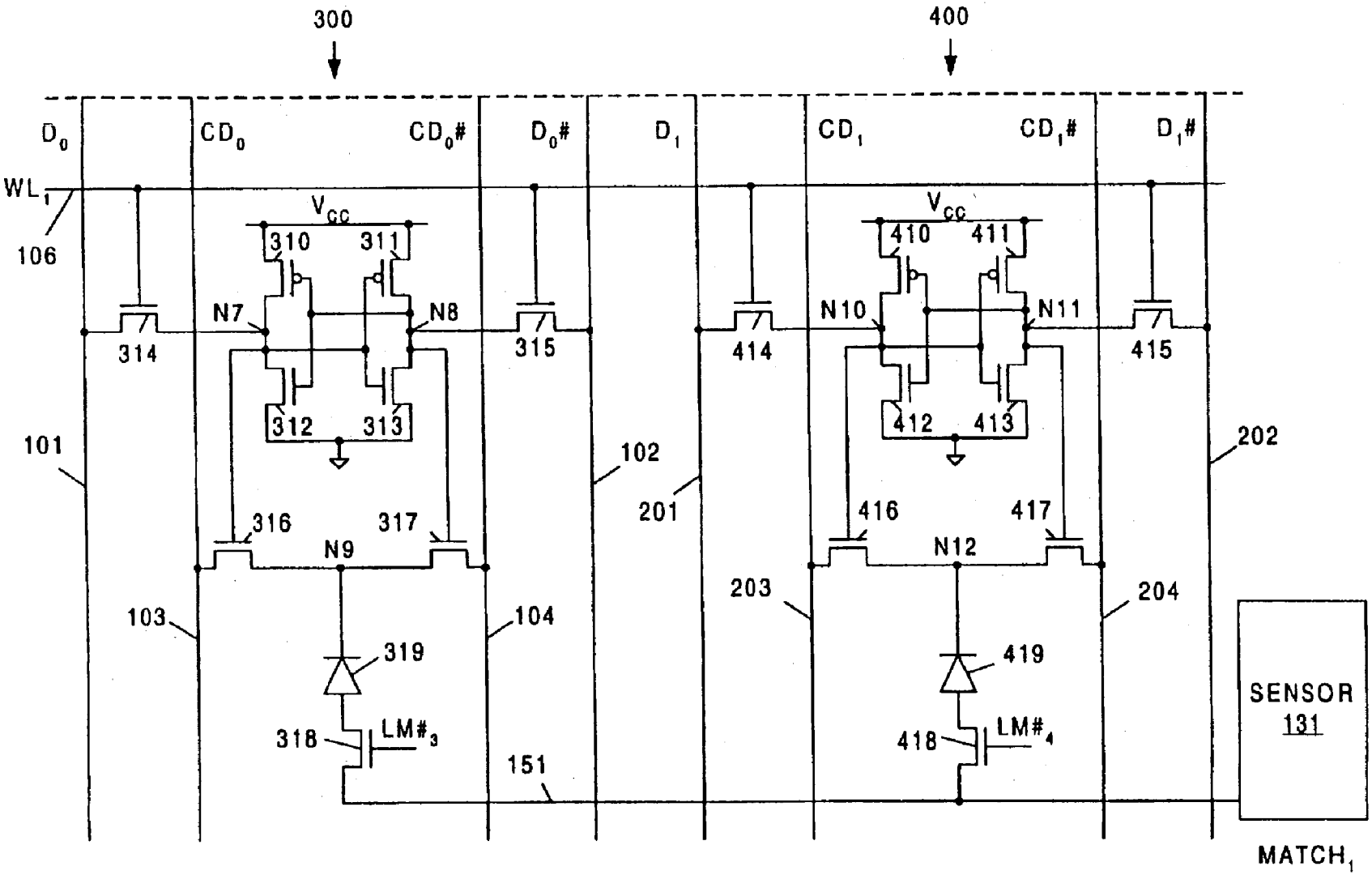

FIG. 3, which consists of FIGS. 3A and 3B as illustrated, is a schematic diagram of an array of nine-transistor CAM cells 100, 200, 300 and 400. CAM cell 100 includes read/write bit lines 101–102, compare bit lines 103–104, word line 105, p-channel transistors 110–111, n-channel transistors 112–118, and diode element 119. P-channel transistors 110–111 and n-channel transistors 112–115 are connected as a six-transistor SRAM cell. More specifically, transistors 110 and 112 are connected in series between the $V_{CC}$ supply terminal and the ground supply terminal to form a first inverter 121. Similarly, transistors 111 and 113 are connected between the $V_{CC}$ supply terminal and the ground supply terminal to form a second inverter 122. Inverters 121 and 122 are cross-coupled, thereby forming a storage latch that stores a data value $D_0$. The output terminal of inverter 121 is labeled node N1, and the output terminal of inverter 122 is labeled node N2.

N-channel transistor 114 is coupled as an access transistor between node N1 and read/write bit line 101. Similarly, n-channel transistor 115 is coupled as an access transistor between node N2 and read/write bit line 102. Read/write bit lines 101 and 102 are coupled to receive read/write data values $D_0$ and $D_0$#, respectively, from column decoder circuitry (not shown). Read/write data value $D_0$ has a logic high value of $V_{CC}$ and a logic low level of 0 Volts during a write operation. Similarly, read/write data value $D_0$ has a logic high value of $V_{CC}$ and a logic low level of $V_{CC}$–CV during a read operation (where CV is about 300 mV). The gates of access transistors 114 and 115 are commonly connected to word line 105. Word line 105 is coupled to receive word line signal $WL_0$ from row decoder circuitry (not shown). The word line signal $VL_0$ has a logic high value of $V_{CC}$ and a logic low value of 0 Volts.

Figure 5:
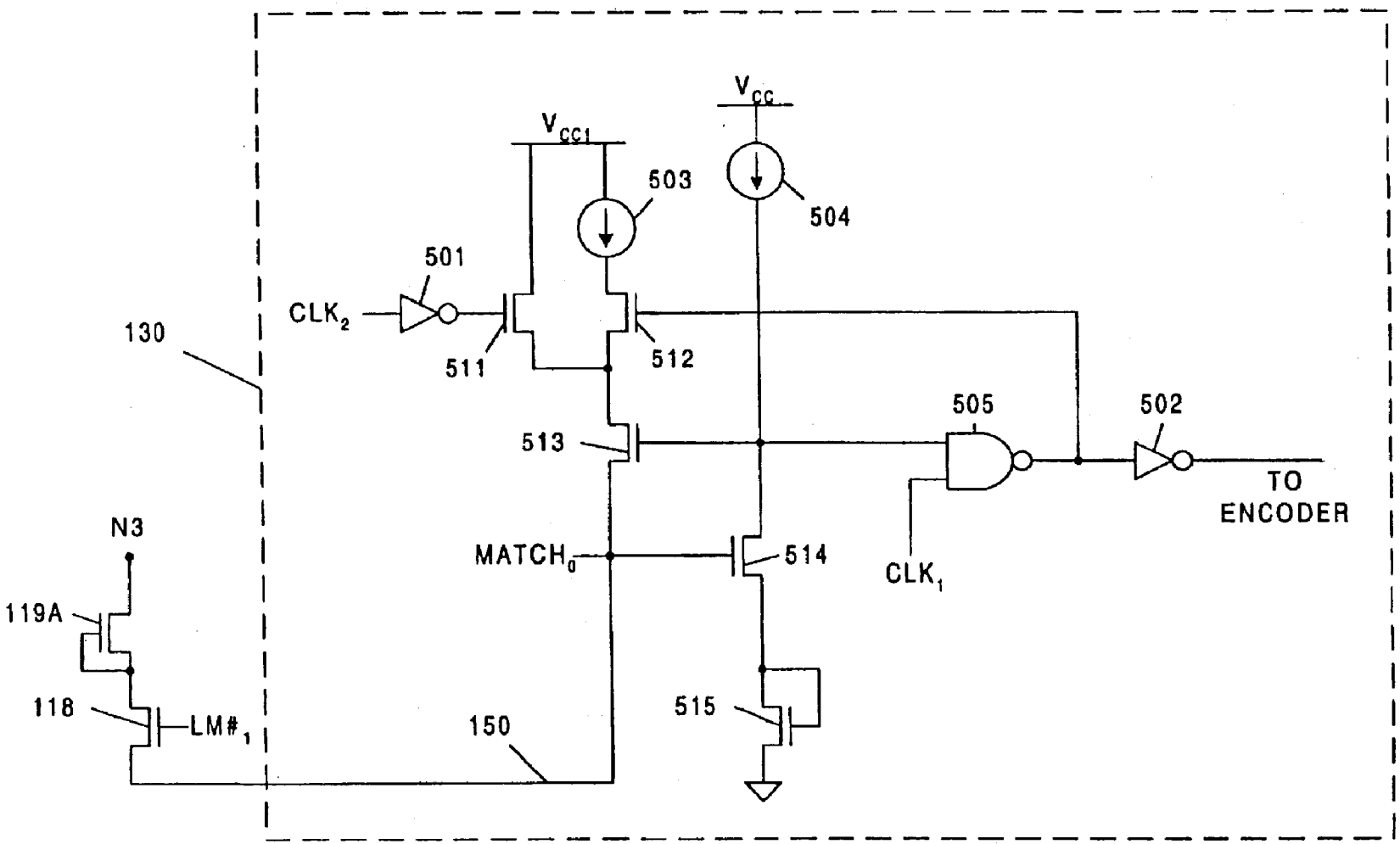
FIG. 5 is a schematic diagram of the sensor circuit of FIG. 3 in accordance with one embodiment of the present invention.

Comparison bit lines 103 and 104 are coupled to receive comparison data values $CD_0$ and $CD_0$# from bit line control circuit 120, which is described in more detail below in connection with FIG. 5. Comparison data value $CD_0$ has a logic high value of 0.6 Volts, a logic low value of 0 Volts, and a pre-charge value of 0.3 Volts. Thus, the voltages used during a comparison operation are much lower than the $V_{CC}$ supply voltage. Moreover, bit line control circuit 120 operates in response to a supply voltage $V_{CC1}$, which is much less than the $V_{CC}$ supply voltage. In the described embodiment, the $V_{CC1}$ supply voltage is about 0.9 Volts. As a result, the power requirements of CAM cell 100 are much less than a conventional 9-T CAM cell. In addition, the bit lines 103–104 used to perform a comparison are not coupled to the 6-T SRAM cell. As a result, the comparison operation is not burdened by the capacitance introduced by the 6-T SRAM cell. N-channel transistors 116 and 117 are connected in series between bit lines 103 and 104. Transistors 116 and 117 are commonly connected at node N3. The gates of transistors 116 and 117 are connected to nodes N1 and N2, respectively. Node N3 is coupled to a match sense line 150 through diode element 119 and n-channel transistor 118. Match sense line 150 is coupled to sensor circuit 130.

Figure 4A:
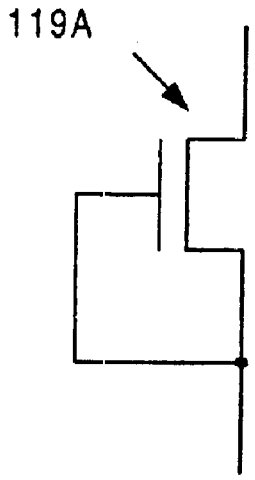
FIGS. 4A and 4B are schematic diagrams of diode connected transistors that can be used in various embodiments of the invention.
Figure 4B:
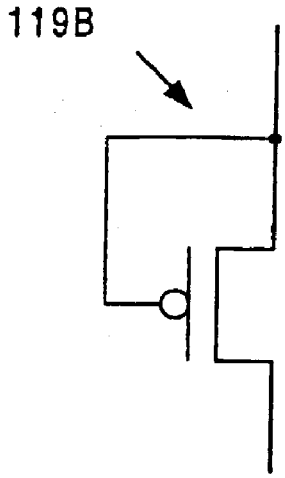
Figure 4C:
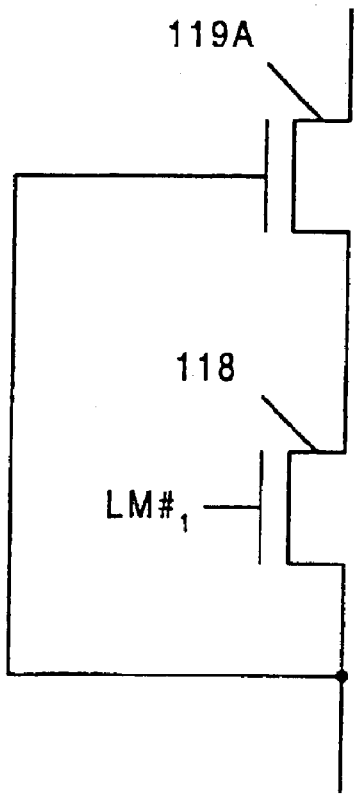
FIG. 4C is a schematic diagram of a diode-connected transistor and a local masking transistor in accordance with another embodiment of the invention.

Diode element 119 can be implemented in various ways, including a conventional p-n junction or a diode-connected transistor. FIGS. 4A and 4B are schematic diagrams of diode connected transistors 119A and 119B, respectively, that can be used to implement diode element 119 in accordance with various embodiments of the invention. Thus, diode element 119 is counted as one of the nine transistors of CAM cell 100. As described in more detail below, n-channel transistor 118 is an optional local masking transistor. Because local masking transistor 118 is optional, this transistor is typically not included in determining the transistor count of CAM cell 100. Local masking transistor 118 is coupled to receive a local mask enable signal $LM\#_1$. FIG. 4c is a schematic diagram illustrating local masking transistor 118 coupled to diode connected transistor 119A in accordance with another variation.

CAM cell 200 includes read/write bit lines 201–202, comparison bit lines 203–204, word line 105, p-channel transistors 210–211, n-channel transistors 212–218, and diode element 219. The elements of CAM cell 200 are connected in the same manner as the elements of CAM cell 100. CAM cell 200 is connected to word line 105 in the same manner as CAM cell 100. Similarly, CAM cell 200 is connected to match sense line 150 in the same manner as CAM cell 100. Read/write bit lines 201 and 202 of CAM cell 200 are coupled to receive read/write data values $D_1$ and $D_1\#$ from column control circuitry (not shown). Comparison bit lines 203 and 204 of CAM cell 200 are coupled to receive comparison data values $CD_1$ and $CD_1\#$ from bit line control circuit 220.

CAM cell 300 includes read/write bit lines 101–102, comparison bit lines 103–104, word line 106, p-channel transistors 310–311, n-channel transistors 312–318, and diode element 319. Similarly, CAM cell 400 includes read/write bit lines 201–202, comparison bit lines 203–204, word line 106, p-channel transistors 410–411, n-channel transistors 412–418, and diode element 419. The elements of CAM cells 300 and 400 are connected in the same manner as the elements of CAM cell 100. CAM cells 300 and 400 are coupled to a second word line 106 in the same manner that CAM cells 100 and 200 are coupled to word line 105. Similarly, CAM cells 300 and 400 are coupled to a second match sense line 151 in the same manner that CAM cells 100 and 200 are coupled to match sense line 150. Match sense line 151 is coupled to a sensor circuit 131, which is identical to sensor circuit 130. Note that CAM cells 100 and 300 share bit lines 101–104. Similarly, CAM cells 200 and 400 share bit lines 201–204.

Although the array illustrated in FIG. 3 only has two rows and two columns of CAM cells, it is understood that this array can be expanded to include many more rows and columns of CAM cells. The manner of expansion is obvious in view of the 2×2 array of CAM cells 100, 200, 300 and 400 shown in FIG. 3. In a particular example, an array of CAM cells includes eight rows and seventy-two columns of CAM cells.

Data values are written to a row of CAM cells (e.g., CAM cells 100 and 200), as follows. The voltage $WL_0$ on word line 105 is pulled up to the $V_{CC}$ supply voltage (e.g., 2.5 Volts) by the row decoder circuitry. As a result, access transistors 114–115 and 214–215 are turned on, thereby coupling bit lines 101–102 and 201–202 to the storage latches in CAM cells 100 and 200. The voltage $WL_1$ on the second word line 106 is pulled down to 0 Volts, thereby turning off access transistors 314–315 and 414–415 in CAM cells 300 and 400. As a result, bit lines 101–102 and 201–202 are isolated from the storage latches in CAM cells 300 and 400.

The column decoder circuitry applies write data values $D_0$, $D_0\#$, $D_1$, and $D_1\#$ to bit lines 101, 102, 201 and 202, respectively. These write data values have a logic high value equal to the $V_{CC}$ supply voltage and a logic low value of 0 Volts. In the described example, data values $D_0$, $D_0\#$, $D_1$, and $D_1\#$ have values of $V_{CC}$, 0, 0 and $V_{CC}$, respectively. The write data values $D_0$, $D_0\#$, $D_1$, and $D_1\#$ are transmitted through turned on access transistors 114–115 and 214–215 to the storage latches in CAM cells 100 and 200. The word line signal $WL_0$ is then de-asserted low, thereby turning off access transistors 114–115 and 214–215, and latching the write data values $D_0$, $D_0\#$, $D_1$, and $D_1\#$ in the storage latches of CAM cells 100 and 200. Write operations are therefore performed in the same manner as in a conventional six-transistor SRAM array. In the present example, nodes N1, N2, N4 and N5 store voltages of $V_{CC}$, 0 Volts, 0 Volts and $V_{CC}$, respectively.

Data values are read from a row of CAM cells (e.g., CAM cells 100 and 200), as follows. The column decoder circuitry applies the $V_{CC}$ supply voltage to read/write bit lines 101, 102, 201 and 202. The voltage $WL_0$ on word line 105 is pulled up to the $V_{CC}$ supply voltage (e.g., 2.5 Volts) by the row decoder circuitry. As a result, access transistors 114–115 and 214–215 are turned on, thereby coupling bit lines 101–102 and 201–202 to the storage latches in CAM cells 100 and 200. The voltage $WL_1$ on the second word line 106 is pulled down to 0 Volts, thereby turning off access transistors 314–315 and 414–415 in CAM cells 300 and 400. As a result, bit lines 101–102 and 201–202 are isolated from the storage latches in CAM cells 300 and 400.

In the present example, nodes N2 and N4 are pulled down through transistors 113 and 212, respectively. When access transistors 115 and 214 are turned on, bit lines 102 and 201 are pulled down by transistors 113 and 212, respectively. Nodes N2 and N4 are pulled down to $V_{CC}$–CV at this time, where CV is approximately 300 mV. Bit lines 101 and 202 are not pulled down in this manner. Sense amplifiers (not shown) coupled to bit lines 101–102 and 201–202 sense the different voltages on these bit lines to identify the data values stored by CAM cells 100 and 200. Read operations are therefore performed in the same manner as in a conventional six-transistor SRAM array.

During standby conditions, word lines 105 and 106 are maintained at 0 Volts, thereby isolating the CAM cells 100, 200, 300 and 400 from read/write bit lines 101–102 and 201–202. Read/write bit lines 101–102 and 201–202 are held at either $V_{CC}$ or 0 Volts during standby conditions.

A compare operation is performed as follows. During a compare operation, word lines 105 and 106 are maintained at a voltage of 0 Volts, thereby isolating the CAM cells 100, 200, 300 and 400 from bit lines 101–102 and 201–202. Read/write bit lines 101–102 and 201–202 are held at either $V_{CC}$ or 0 Volts during a compare operation. A compare operation is simultaneously performed within each CAM cell of the array, unless there is global or local masking that inhibits the compare operation within the CAM cell. For purposes of clarity, a compare operation within CAM cell 100 is described in detail. The compare operations performed within CAM cells 200, 300 and 400 are identical to the compare operation performed within CAM cell 100.

The compare operation within CAM cell 100 is controlled by bit line control circuit 120 and sensor circuit 130. In general, the data value in the storage latch of CAM cell 100 turns on one and only one of transistors 116 and 117, thereby coupling one of the comparison bit lines 103–104 to node N3. Prior to the comparison operation, node N3 and comparison bit lines 103–104 are maintained at 0.3 Volts (assuming there is no global masking enabled by bit line control circuit 120). Local masking transistor 118 is turned on (assuming there is no local masking enabled within CAM cell 100). Sensor circuit 130 maintains match sense line 150 at a voltage of 0.6 Volts. A 0.3 Volt forward voltage drop therefore exists across diode-connected transistor 119A.

To initiate the comparison operation, bit line control circuit 120 applies comparison data values $CD_0$ and $CD_0$# to comparison bit lines 103 and 104, respectively. The logic high comparison data value has a voltage of 0.6 Volts, and the logic low comparison data value has a voltage of 0 Volts. If the comparison data value matches the data value stored in CAM cell 100, then a voltage of 0.6 Volts is applied to node N3. Under these conditions, the voltage on match sense line 150 remains at 0.6 Volts. If the comparison data value does not match the data value stored in CAM cell 100, then a voltage of 0 Volts is applied to node N3. Under these conditions, the voltage on match sense line 150 is pulled down to 0.3 Volts. Sensor circuit 130 senses the voltage on match sense line 150, and indicates a match condition if match sense line 150 is maintained at 0.6 Volts, and indicates a no-match condition if match sense line 150 is pulled down to 0.3 Volts. Because the full signal swing on match sense line 150 is equal to 0.3 Volts, and because the comparison bit lines are operated at voltages much less than the $V_{CC}$ supply voltage, the power requirements of a compare operation are advantageously very low in CAM cell 100.

Local masking signal $LM\#_1$ is an active low signal. If the local masking signal $LM\#_1$ has a logic low value, local masking transistor 118 is turned off, thereby isolating node N3 from match sense line 150. Under these conditions, match sense line is maintained at 0.6 Volts, regardless of the results of the comparison within CAM cell 100. CAM cell 100 therefore performs as if a match condition exists, regardless of the results of the comparison within CAM cell 100. In this manner, local masking transistor 118 enables CAM cell 100 to be effectively masked from the comparison operation. Although FIG. 3 indicates that local masking transistor 118 is coupled between diode 119 and match line 150, it is understood that local masking transistor 118 can be coupled between diode 119 and node N3 to achieve similar results. FIG. 4C is a schematic diagram illustrating another possible arrangement of diode-connected transistor 119A and local masking transistor 118. Other variations are apparent to those of ordinary skill in the art.

Bit line control circuit 120 and sensor circuit 130 will now be described in more detail. FIG. 5 is a schematic diagram of sensor circuit 130. Sensor circuit 130 includes inverters 501–502, current sources 503–504, NAND gate 505 and n-channel transistors 311–511, which are connected as illustrated. During a pre-charge period before the compare operation is performed, the CLK1 and CLK2 signals have logic low values. The logic low CLK2 signal causes transistor 511 to turn on, thereby coupling the $V_{CC1}$ supply voltage to the drain of transistor 513. In the described example, the $V_{CC1}$ supply voltage is equal to approximately three times the threshold voltage of an n-channel transistor, or about 0.9 Volts. The logic low CLK1 signal causes NAND gate 505 to provide a logic high output signal (e.g., 2.5 Volts) to the gate of transistor 512, thereby turning on this transistor. As a result, transistor 512 also helps to pull up the voltage on the drain of transistor 513 to the $V_{CC1}$ supply voltage.

Under these conditions, transistors 514 and 515 are turned on by current source 504. Each of transistors 514 and 515 has a threshold voltage of 0.3 Volts. As a result, the voltage on match sense line 150 is held at 0.6 Volts. At this time, the voltage on node N3 is equal to 0.3 Volts, or one threshold voltage below the voltage on match sense line 150.

The compare operation begins when the CLK2 signal goes high. The CLK2 signal transitions to a logic high state shortly before the CLK1 signal transitions to a logic high state. As a result, the output signal provided by NAND gate 505 remains high for a short time after the CLK2 signal goes high. This ensures that transistor 512 remains on while the CLK2 signal goes high, thereby preventing noise conditions from pulling down the voltage on match sense line 150. The CLK1 signal then transitions to a logic high value, such that the output voltage provided by NAND gate 505 is determined by the state of the voltage on match sense line 150. At this time, node N3 is either pulled up to 0.3 Volts (if a match condition exists) or pulled down to 0 Volts (if a no-match condition exists).

As described in more detail below, during a match condition node N3 will be coupled to a comparison bit line having a voltage of 0.6 Volts through either transistor 116 or transistor 117. Under these conditions, no current flows through transistor 513. As a result, the gate of transistor 513 is maintained at about 0.6 Volts. This 0.6 Volt signal represents a logic low input signal to NAND gate 505. As a result, NAND gate 505 provides a logic high output signal to transistor 512. Transistor 512 therefore remains on (even though there is no current flow). If the signal on match sense line 150 is pulled low by noise, then current source 503 will pull the voltage on match sense line 150 back up to 0.6 Volts through turned on transistor 512.

The logic high output of NAND gate 505 is also provided to inverter 502. In response, inverter 502 provides a logic low output signal having a voltage equal to the ground supply voltage (e.g., 0 Volts). This output signal is used to indicate a match condition to an encoder circuit (not shown). As described in more detail below, during a no-match condition node N3 will be coupled to a comparison bit line having a voltage of 0 Volts through either transistor 116 or transistor 117. As a result, node N3 is pulled down to 0 Volts. Under these conditions, current will flow through transistor 513. This current is greater than the current provided by current source 503. As a result, the voltage of match sense line 150 is pulled down to 0.3 Volts (i.e., one threshold voltage greater than the voltage on node N3). The 0.3 Volt signal on match sense line 150 causes the voltage on the gate of transistor 513 to be pulled up to the $V_{CC}$ supply voltage (e.g., 2.5 Volts) by current source 504. This $V_{CC}$ supply voltage represents a logic high input signal to NAND gate 505. Consequently, NAND gate 505 provides a logic low output signal to the gate of transistor 512. As a result, transistor 512 is turned off, thereby preventing DC current flow through transistor 513.

The logic low output of NAND gate 505 is also provided to inverter 502. In response, inverter 502 provides a logic high output signal having a voltage equal to the $V_{CC}$ supply voltage (e.g., 2.5 Volts). This output signal is used to indicate a no-match condition to an encoder circuit (not shown).

Although the operation of sensor circuit 130 has been described in connection with a single CAM cell 100, it is understood that a match condition must exist in all of the CAM cells coupled to match sense line 150 in order for sensor circuit 130 to provide a logic high output signal to the encoder. Conversely, if a no-match condition exists in any one of the CAM cells coupled to match sense line 150, then sensor circuit 130 will provide a logic low output signal to the encoder.

Figure 6:
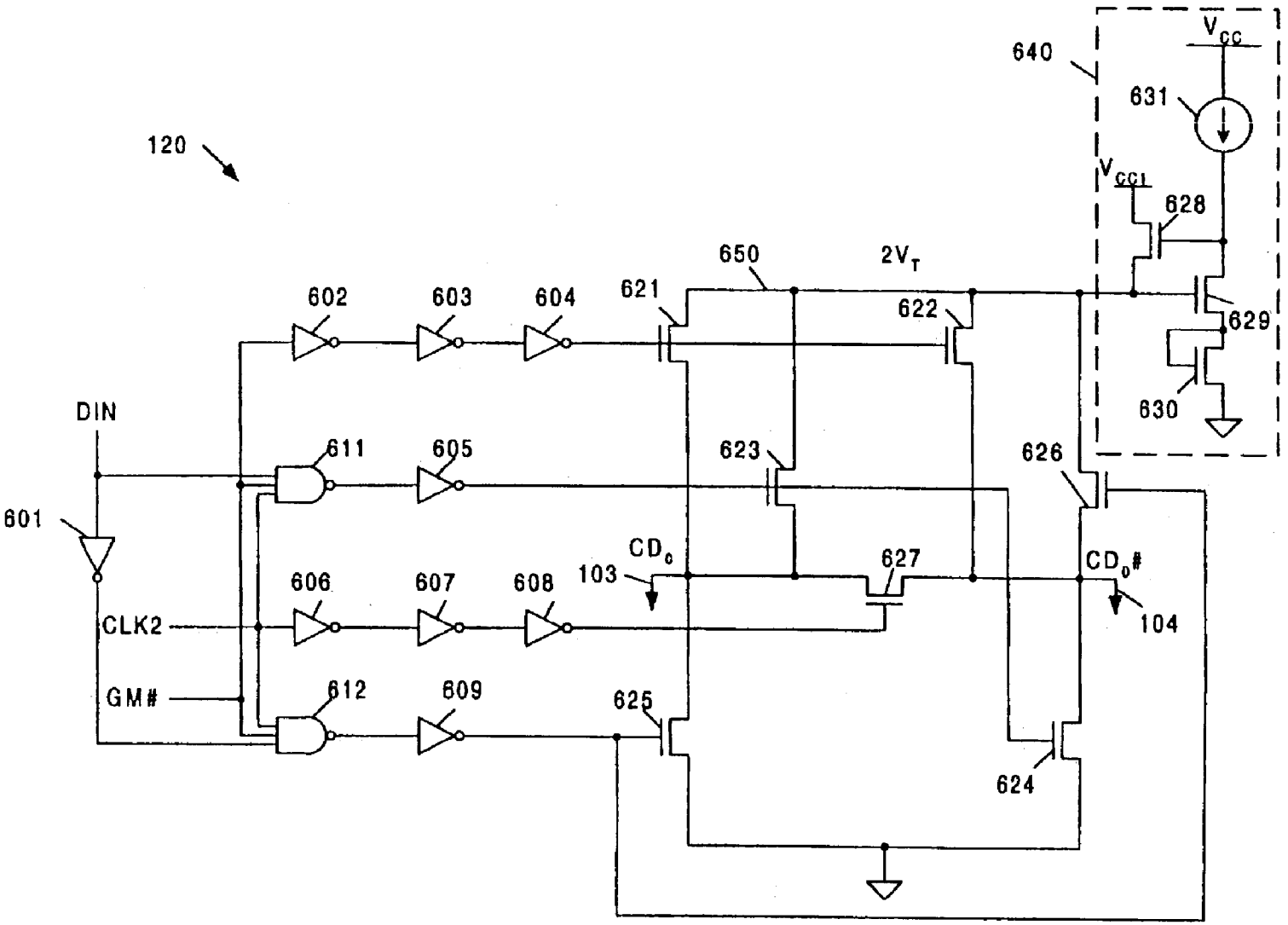
FIG. 6 is a schematic diagram of the bit line control circuit of FIG. 3 in accordance with one embodiment of the present invention.

FIG. 6 is a schematic diagram of bit line control circuit 120. Bit line control circuit 121 is identical to bit line control circuit 120. Bit line control circuit 120 includes inverters 601–609, NAND gates 611–612, n-channel transistors 621–630 and current source 631, which are connected as illustrated. In general, bit line control circuit 120 provides voltages on comparison bit lines 103–104 in response to a comparison data input value $D_{IN}$, the clock signal CLK2, and a global masking signal GM#.

Bit line control circuit 120 operates as follows. Transistors 628–630 and current source 631 are connected to form a regulated voltage source 640. Current source 631, which operates in response to the $V_{CC}$ supply voltage, turns on transistors 629 and 630. Each of transistors 629 and 630 has a threshold voltage of 0.3 Volts. As a result, the voltage on voltage supply line 650 is held at 0.6 Volts. Transistor 628, which is coupled to the $V_{CC1}$ voltage supply (0.9 Volts), is turned on to help pull up voltage supply line 650 to 0.6 Volts. In the described embodiment, the voltage on voltage supply line 650 is selected to be equal to two times the threshold voltage of an n-channel transistor (i.e., 0.3 Volts).

Global masking signal GM# is an active low signal. When the global masking signal GM# has a logic low value, inverters 602–604 provide a logic high signal to transistors 621 and 622, thereby turning on these transistors. The logic low GM# signal causes transistors 623–626 to be turned off. Transistor 627 is either turned off or turned on, depending on the state of the CLK2 signal. Under these conditions, both of comparison bit lines 103 and 104 are connected to receive a voltage of 0.6 Volts from voltage supply line 650. If both of comparison bit lines 103 have a voltage of 0.6 Volts, then all of the CAM cells in the column served by bit line control circuit 120 will indicate a match condition during a compare operation. As a result, the entire column is effectively masked during such a compare operation.

When the global masking signal GM# is de-asserted high, transistors 621 and 622 are turned off. During this time, the CLK2 signal can have a logic low or logic high value. A pre-charge operation is performed if the CLK2 signal has a logic low value, and a compare operation is performed if the CLK2 signal has a logic high value. If the CLK2 signal has a logic low value, transistor 627 is turned on, thereby connecting comparison bit lines 103 and 104. The logic low CLK2 signal further causes transistors 623–626 to turn off, thereby isolating comparison bit lines 103 and 104 from voltage supply line 650 and the ground voltage supply. As a result, the voltages on both bit lines 103 and 104 are equalized at 0.3 Volts by sensor circuit 130 during the pre-charge operation. Note that the comparison data input value $D_{IN}$ does not have any effect on transistors 623–627 when the CLK2 signal has a logic low value.

A compare operation occurs when the CLK2 signal transitions to a logic high value (and the GM# signal is de-asserted high). Under these conditions, transistors 621–622 and 627 are turned off. Comparison data input value $D_{IN}$ is asserted at this time. A comparison data input value $D_{IN}$ having a logic high state will turn on transistors 623 and 624 (and turn off transistors 625 and 626), thereby applying 0.6 Volts to comparison bit line 103 and 0 Volts to comparison bit line 104. Conversely, a comparison data input value $D_{IN}$ having a logic low state will turn on transistors 625 and 626 (and turn off transistors 623 and 624), thereby applying 0.6 Volts to comparison bit line 104 and 0 Volts to comparison bit line 103.

Figure 7A:
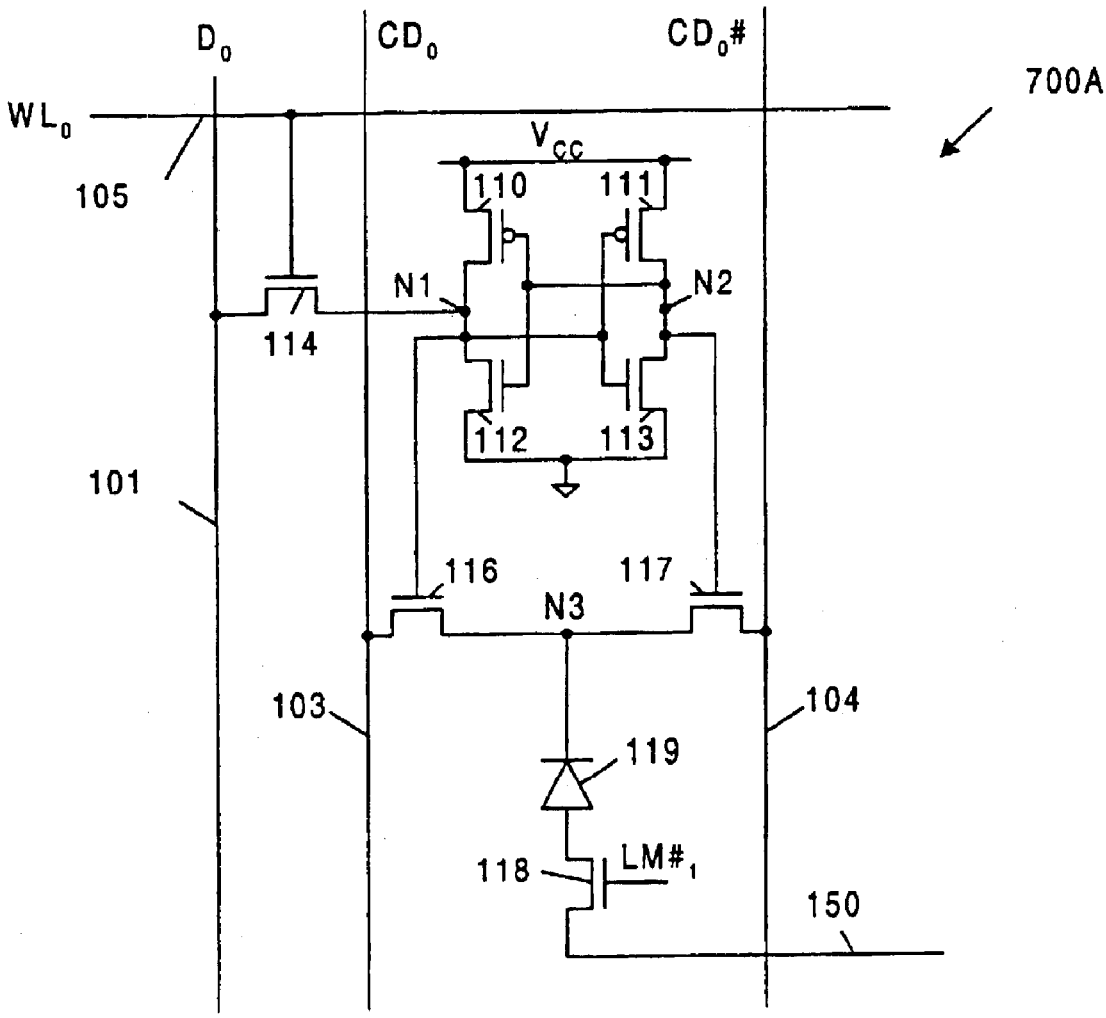
FIG. 7A is a schematic diagram of an 8-T CAM cell in accordance with one variation of the present invention.

Although the present invention has been described in connection with particular embodiments, other embodiments are possible and are considered to be within the scope of the present invention. FIG. 7A is a schematic diagram of an 8-T CAM cell 700A in accordance with one variation of the present invention. Similar elements in CAM cell 100 (FIG. 3) and CAM cell 700A are labeled with similar reference numbers. CAM cell 700A includes the same elements as CAM cell 100, with the exception of access transistor 115 and bit line 102, which are not present in CAM cell 700A. CAM cell 700A is written and read through bit line 101 and access transistor 114. The compare operation of CAM cell 700A is identical to the compare operation of CAM cell 100. CAM cell 700A advantageously uses one less transistor and one less bit line than CAM cell 100. Note that the above-described variations of CAM cell 100 can also be applied to CAM cell 700A.

Figure 7B:
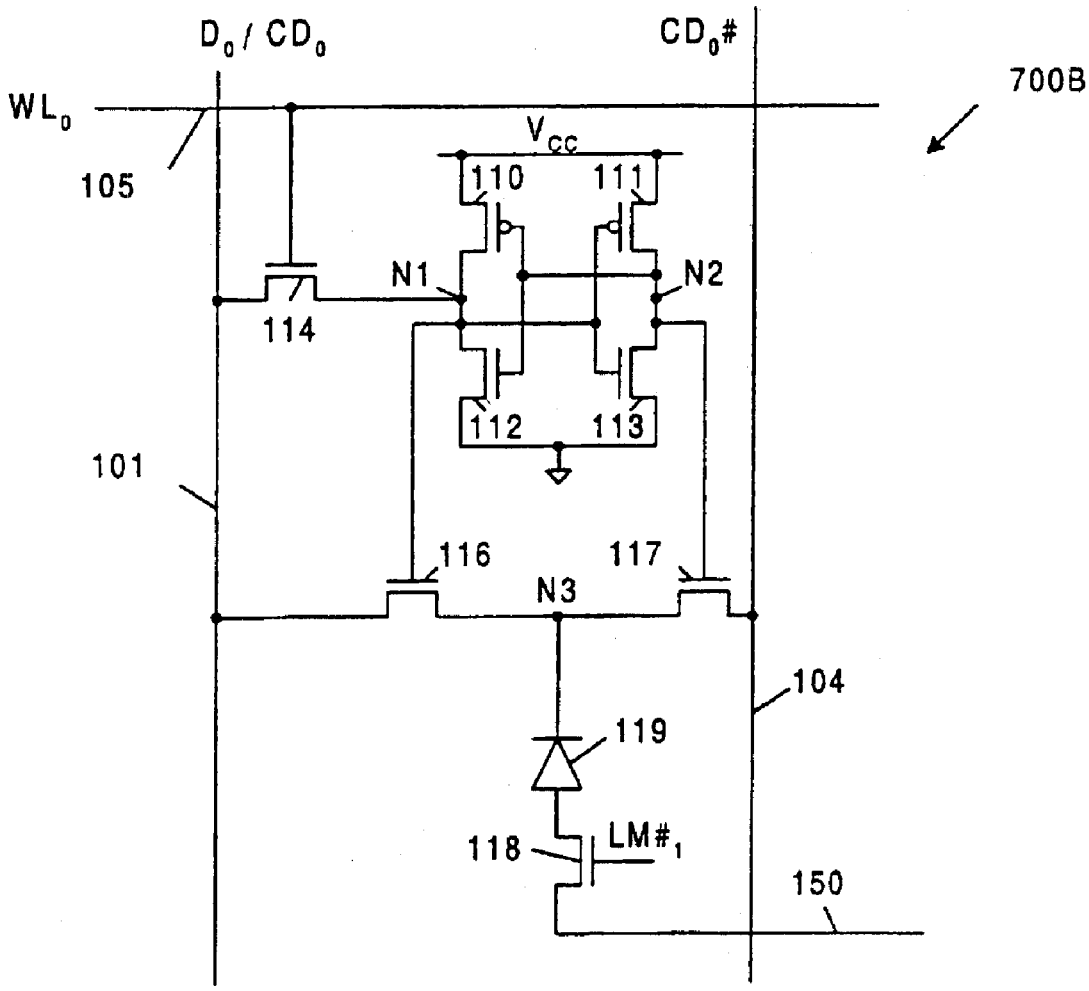
FIG. 7B is a schematic diagram of an 8-T CAM cell in accordance with another variation of the present invention.

FIG. 7B is a schematic diagram of an 8-T CAM 700B in accordance with another variation of the present invention. Similar elements in CAM cell 100 (FIG. 3) and CAM cell 700B are labeled with similar reference numbers. CAM cell 700B includes the same elements as CAM cell 100, with the exception of access transistor 115 and bit lines 102 and 103, which are not present in CAM cell 700B. CAM cell 700B is written and read through bit line 101 and access transistor 114. The compare operation of CAM cell 700B is similar to the compare operation of CAM cell 100. However, the comparison data value $CD_0$ is provided on bit line 101 in this variation. Selection circuitry (not shown) is provided to selectively couple bit line 101 to the above-described column select circuitry (not shown) during a read or a write operation, or to the bit line control circuit 120 during a compare operation. CAM cell 700B advantageously uses one fewer transistor and two fewer bit lines than CAM cell 100. Note that the above-described variations of CAM cell 100 can also be applied to CAM cell 700B.

FIG. 8, which consists of FIGS. 8A and 8B as illustrated, is a schematic diagram of an array of nine-transistor CAM cells 1000, 2000, 3000 and 4000. Because CAM cells 1000, 2000, 3000 and 4000 are similar to CAM cells 100, 200, 300 and 400 (FIG. 3), similar elements in FIGS. 3 and 8 are labeled with similar reference numbers. CAM cell 1000 replaces diode element 119, local masking transistor 118 and match sense line 150 of CAM cell 100 with match transistor 1190, local masking transistor 1180 and match sense lines 1500 and 1510. Transistors 1180 and 1190 are connected in series between match sense lines 1500 and 1510. The gate of match transistor 1190 is coupled to node N3. Both of match sense lines 1500 and 1510 are connected to sensor circuit 1300.

CAM cells 2000, 3000 and 4000 include similar match transistors 2190, 3190 and 4190 and similar local masking transistors 2180, 3180 and 4180. CAM cells 3000 and 4000 share match sense lines 1520 and 1530, which in turn, are connected to sensor circuit 1310.

Bit line control circuits 1200 and 2200 are connected to comparison bit lines 103–104 and 203–204, respectively.

Although the array illustrated in FIG. 8 only has two rows and two columns of CAM cells, it is understood that this array can be expanded to include many more rows and columns of CAM cells. The manner of expansion is obvious in view of the 2×2 array of CAM cells 1000, 2000, 3000 and 4000 shown in FIG. 8.

Because CAM cells 1000, 2000, 3000 and 4000 are identical, only CAM cell 1000 is described in detail. Similarly, because sensor circuits 1300 and 1310 are identical, only sensor circuit 1300 is described in detail.

CAM cell 1000 reverses the polarity of the comparison data values $CD_0$ and $CD_0$# provided by bit line control circuit 120, such that comparison data value $CD_0$# is applied to comparison bit line 103, and comparison data value $CD_0$ is applied to comparison bit line 104. In addition, voltage supply line 650 is directly connected to the $V_{CC1}$ supply voltage of 0.9 Volts ($3V_T$) instead of to regulated voltage source 640. Otherwise, the bit line control circuit 1200 is identical to bit line control circuit 120 (FIG. 6).

Read, write and standby operations are performed within CAM cell 1000 in the same manner described above in connection with CAM cell 100.

A compare operation is performed within CAM cell 1000 as follows. During a compare operation, word lines 105 and 106 are maintained at a voltage of 0 Volts, thereby isolating the CAM cells 1000, 2000, 3000 and 4000 from bit lines 101–102 and 201–202. Read/write bit lines 101–102 and 201–202 are held at either $V_{CC}$ or 0 Volts during a compare operation. A compare operation is simultaneously performed within each CAM cell of the array, unless there is global or local masking that inhibits the compare operation within the CAM cell. For purposes of clarity, a compare operation within CAM cell 1000 is described in detail. The compare operations performed within CAM cells 2000, 3000 and 4000 are identical to the compare operation performed within CAM cell 1000.

The compare operation within CAM cell 1000 is controlled by bit line control circuit 1200 and sensor circuit 1300. In general, the data value in the storage latch of CAM cell 1000 turns on one and only one of transistors 116 and 117, thereby coupling one of the comparison bit lines 103–104 to node N3. Prior to the comparison operation, node N3 and comparison bit lines 103–104 are maintained at 0.3 Volts (assuming there is no global masking enabled by bit line control circuit 1200). Local masking transistor 1180 is turned on (assuming there is no local masking enabled within CAM cell 1000). Sensor circuit 1300 maintains match sense lines 1500 and 1510 at 0.3 Volts.

To initiate the comparison operation, bit line control circuit 1200 applies comparison data values $CD_0$ and $CD_0$# to comparison bit lines 104 and 103, respectively. The logic high comparison data value has a voltage of 0.9 Volts (i.e., $V_{CC1}$ or $3V_T$), and the logic low comparison data value has a voltage of 0 Volts. If the comparison data value matches the data value stored in CAM cell 1000, then a voltage of 0 Volts is applied to node N3. Under these conditions, match transistor 1190 is turned off, thereby allowing the voltage on match sense line 1500 to remain at 0.3 Volts. If the comparison data value does not match the data value stored in CAM cell 1000, then a voltage of 0.9 Volts is applied to node N3. Under these conditions, 1 match transistor 1190 turns on, thereby pulling down the voltage on match sense line 1500 down to 0 Volts. Sensor circuit 1300 senses the voltage on match sense line 1500, and indicates a no-match condition if match sense line 1500 is pulled down to 0 Volts, and indicates a match condition if match sense line 1500 remains at 0.3 Volts. Because the full signal swing on match sense line 1500 is equal to 0.3 Volts, and because the bit line control circuit 1200 is powered by the $V_{CC1}$ supply voltage, the power requirements of a compare operation are advantageously very low in CAM cell 1000.

Local masking signal $LM\#_1$ is an active low signal. If the local masking signal $LM\#_1$ has a logic low value, local masking transistor 1180 is turned off, thereby isolating match sense lines 1500 and 1510. Under these conditions, match sense line is maintained at 0.3 Volts, regardless of the results of the comparison within CAM cell 1000. CAM cell 1000 therefore performs as if a match condition exists, regardless of the results of the comparison within CAM cell 1000. In this manner, local masking transistor 1180 enables CAM cell 1000 to be effectively masked from the comparison operation. Although FIG. 8 indicates that local masking transistor 1180 is coupled between match transistor 1190 and match sense line 1510, it is understood that local masking transistor 1180 can be coupled between match transistor 1190 and match sense line 1500 to achieve similar results.

Figure 9:
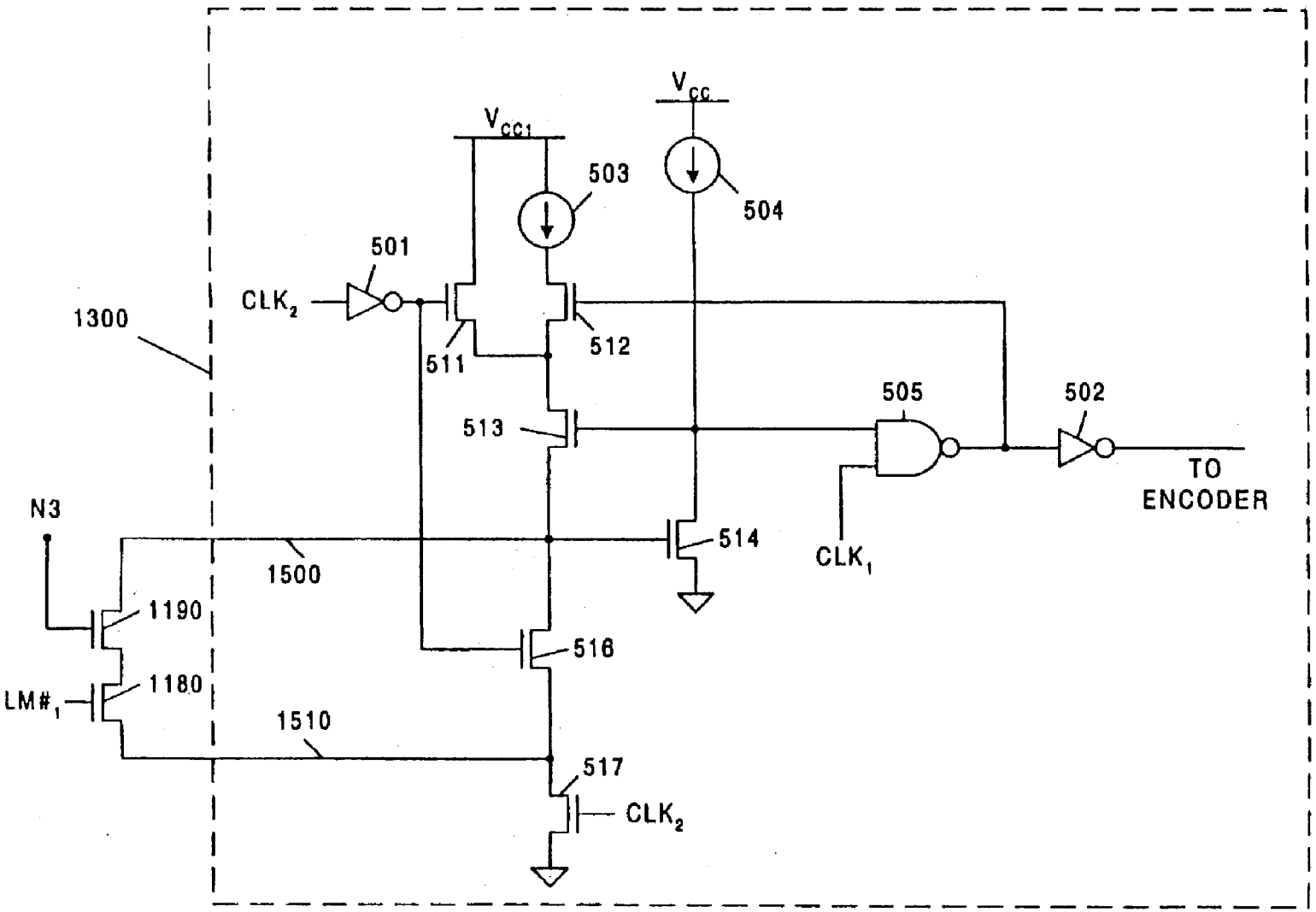
FIG. 9 is a schematic diagram of the sensor circuit of FIG. 8 in accordance with one embodiment of the present invention.

FIG. 9 is a schematic diagram of sensor circuit 1300. Because sensor circuit 1300 is similar to sensor circuit 130 (FIG. 5), similar elements in FIGS. 5 and 9 are labeled with similar reference numbers. Sensor circuit 1300 eliminates transistor 515 of sensor circuit 130, such that the source of transistor 514 is connected to ground. Sensor circuit 1300 further includes n-channel transistor 516, which is connected in series across match lines 1500 and 1510. The gate of transistor 516 is connected to the output terminal of inverter 501. Sensor circuit 1500 also includes n-channel transistor 517, which is connected between match sense line 1510 and the ground supply terminal. The gate of transistor 517 is coupled to receive the CLK2 signal.

During a pre-charge period before the compare operation is performed, the CLK1 and CLK2 signals have logic low values. The logic low CLK2 signal causes transistor 511 to turn on, thereby coupling the $V_{CC1}$ supply voltage to the drain of transistor 513. In the described example, the $V_{CC1}$ supply voltage is equal to approximately three times the threshold voltage of an n-channel transistor, or about 0.9 Volts. The logic low CLK1 signal causes NAND gate 505 to provide a logic high output signal (e.g., 2.5 Volts) to the gate of transistor 512, thereby turning on this transistor. As a result, transistor 512 also helps to pull up the voltage on the drain of transistor 513 to the $V_{CC1}$ supply voltage.

Under these conditions, transistor 514 is turned on by current source 504. Transistor 514 has a threshold voltage of 0.3 Volts. As a result, the voltage on match sense line 1500 is held at 0.3 Volts. The logic low CLK2 signal causes transistor 516 to turn on, thereby coupling match sense lines 1500 and 1510. Consequently, match sense line 1510 is also held at 0.3 Volts.

The compare operation begins when the CLK2 signal goes high. The logic high CLK2 signal causes transistors 511 and 516 to be turned off. The CLK2 signal transitions in a logic high state shortly before the CLK1 signal transitions to a logic high state. As a result, the output signal provided by NAND gate 505 remains high for a short time after the CLK2 signal goes high. This ensures that transistor 512 remains on while the CLK2 signal goes high, thereby preventing noise conditions from pulling down the voltage on match sense line 1500. The CLK1 signal then transitions to a logic high value, such that the output voltage provided by NAND gate 505 is determined by the state of the voltage on match sense line 1500. At this time, node N3 is either pulled up to 0.9 Volts (if a no-match condition exists) or pulled down to 0 Volts (if a match condition exists).

As previously described, during a no-match condition node N3 will be coupled to a comparison bit line having a voltage of 0.9 Volts through either transistor 116 or transistor 117. Under these conditions, match transistor 1190 turns on, and current flows through transistor 513. This current is greater than the current provided by current source 503. As a result, the voltage of match sense line 1500 is pulled down to 0 Volts. The 0 Volt signal on match sense line 1500 causes the voltage on the gate of transistor 513 to be pulled up to the $V_{CC}$ supply voltage (e.g., 2.5 Volts) by current source 304. This $V_{CC}$ supply voltage represents a logic high input signal to NAND gate 505. Consequently, NAND gate 505 provides a logic low output signal to the gate of transistor 512. As a result, transistor 512 is turned off, thereby preventing DC current flow through transistor 513.

The logic low output of NAND gate 505 is also provided to inverter 502. In response, inverter 502 provides a logic high output signal having a voltage equal to the $V_{CC}$ supply voltage (e.g., 2.5 Volts). This output signal is used to indicate a no-match condition to an encoder circuit (not shown).

As described above, during a match condition node N3 will be coupled to a comparison bit line having a voltage of 0 Volts through either transistor 116 or transistor 117. As a result, no current flows through transistor 513. Consequently, the gate of transistor 513 is maintained at about 0.3 Volts. This 0.3 Volt signal represents a logic low input signal to NAND gate 505. As a result, NAND gate 505 provides a logic high output signal to transistor 512. Transistor 512 therefore remains on (even though there is no current flow). If the signal on match sense line 1500 is pulled low by noise, then current source 503 will pull the voltage on match sense line 1500 back up to 0.3 Volts through turned on transistor 512.

The logic high output of NAND gate 505 is also provided to inverter 502. In response, inverter 502 provides a logic low output signal having a voltage equal to 0 Volts. This output signal is used to indicate a match condition to an encoder circuit (not shown).

Although the operation of sensor circuit 1300 has been described in connection with a single CAM cell 1000, it is understood that a match condition must exist in all of the CAM cells coupled to match sense line 1500 in order for sensor circuit 1300 to provide a logic low output signal to the encoder. Conversely, if a no-match condition exists in any one of the CAM cells coupled to match sense line 1500, then sensor circuit 1300 will provide a logic high output signal to the encoder.

Figure 10A:
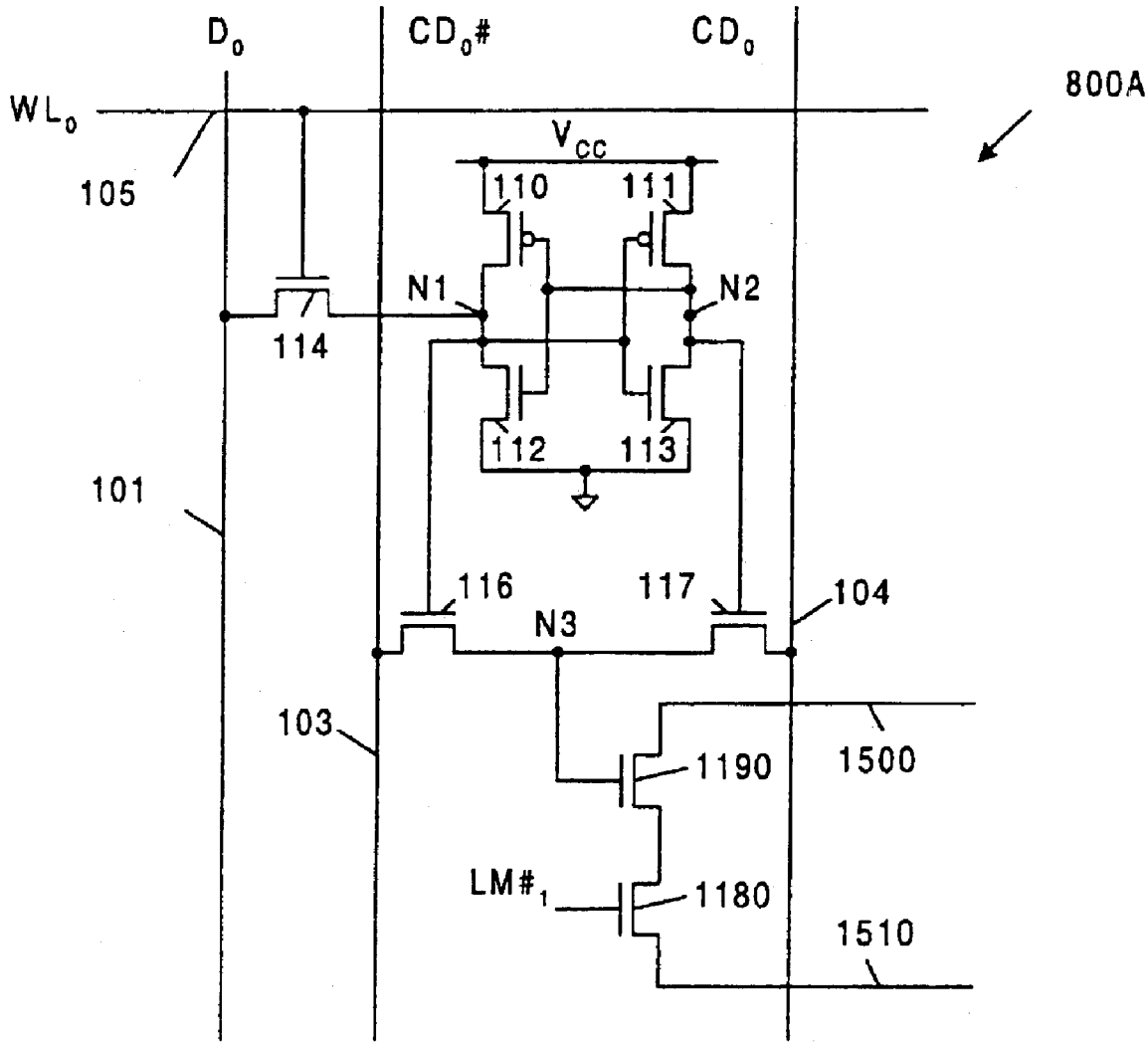
FIG. 10A is a schematic diagram of an 8-T CAM cell in accordance with one variation of the present invention.

Although the present invention has been described in connection with particular embodiments, other embodiments are possible and are considered to be within the scope of the present invention. FIG. 10A is a schematic diagram of an 8-T CAM cell 800A in accordance with one variation of the present invention. Similar elements in CAM cell 1000 (FIG. 8) and CAM cell 800A are labeled with similar reference numbers. CAM cell 800A includes the same elements as CAM cell 1000, with the exception of access transistor 115 and bit line 102, which are not present in CAM cell 800A. CAM cell 800A is written and read through bit line 101 and access transistor 114. The compare operation of CAM cell 800A is identical to the compare operation of CAM cell 1000. CAM cell 800A advantageously uses one less transistor and one less bit line than CAM cell 1000. Note that the above-described variations of CAM cell 1000 can also be applied to CAM cell 800A.

Figure 10B:
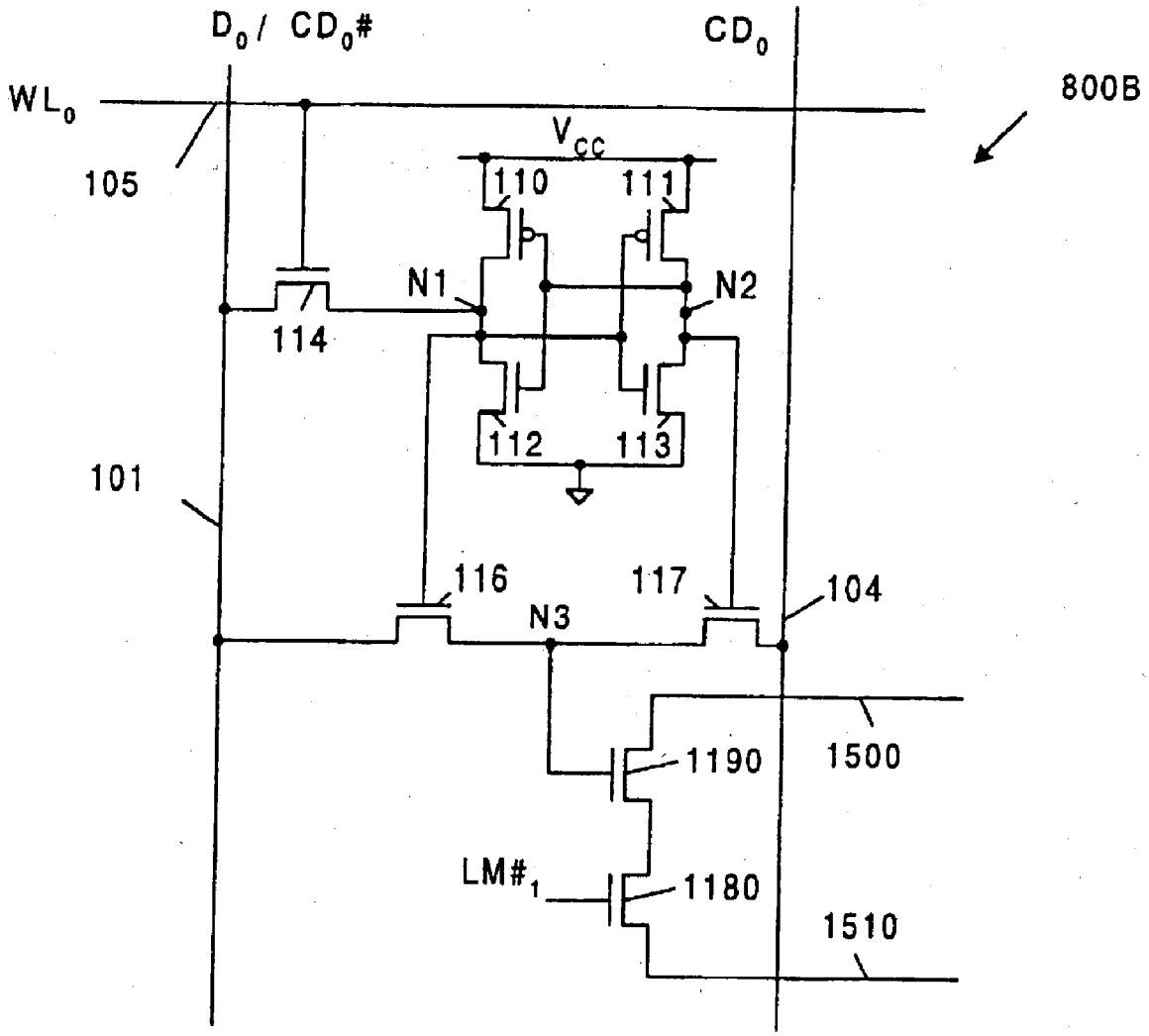
FIG. 10B is a schematic diagram of an 8-T CAM cell in accordance with another variation of the present invention.

FIG. 10B is a schematic diagram of an 8-T CAM cell 800B in accordance with another variation of the present invention. Similar elements in CAM cell 1000 (FIG. 8) and CAM cell 800B are labeled with similar reference numbers. CAM cell 800B includes the same elements as CAM cell 1000, with the exception of access transistor 115 and bit lines 102 and 103, which are not present in CAM cell 800B. CAM cell 800B is written and read through bit line 101 and access transistor 114. The compare operation of CAM cell 800B is similar to the compare operation of CAM cell 1000. However, the comparison data value $CD_0$# is provided on bit line 101 in this variation. Selection circuitry (not shown) is provided to selectively couple bit line 101 to the above-described column select circuitry (not shown) during a read or a write operation, or to the bit line control circuit 120 during a compare operation. CAM cell 800B advantageously uses one fewer transistor and two fewer bit lines than CAM cell 1000. Note that the above-described variations of CAM cell 1000 can also be applied to CAM cell 800B.

Although the present invention has been described in connection with several embodiments, it is understood that this invention is not limited to the embodiments disclosed, but is capable of various modifications which would be apparent to one of ordinary skill in the art. Thus, the invention is limited only by the following claims.

What is claimed is:

1. A content addressable memory (CAM) cell comprising:

a static random access memory (SRAM) cell that operates in response to a $V_{CC}$ supply voltage, the SRAM cell storing a data value;

a first set of one or more bit lines coupled to the SRAM cell, wherein the data value is written to and read from the SRAM cell on the first set bit lines, the first set of bit lines having a signal swing equal to the $V_{CC}$ supply voltage; and a second set of bit lines coupled to receive a comparison data value, the second set of bit lines having a signal swing less than the $V_{CC}$ supply voltage.

2. The CAM cell of claim 1, further comprising a circuit for comparing the data value with the comparison data value to determine whether a match exists.

3. The CAM cell of claim 2, wherein the circuit comprises:

a first transistor having a gate coupled to receive a signal representative of the data value;

and a second transistor having a gate coupled to receive a signal representative of the inverse of the data value.

4. The CAM cell of claim 3, wherein the second set of bit lines comprises:

a first bit line coupled to a source region of the first transistor; and a second bit line coupled to a source region of the second transistor.

5. The CAM cell of claim 4, wherein a drain region of the first transistor is coupled to a drain region of the second transistor at a first node.

6. The CAM cell of claim 5, further comprising a diode element coupled to the first node.

7. The CAM cell of claim 6, further comprising a local mask transistor coupled in series with the diode element.

8. The CAM cell of claim 6, wherein the diode element comprises a diode-connected transistor.

9. The CAM cell of claim 6, wherein the diode element comprises a P-N junction.

10. The CAM cell of claim 6, further comprising a match line coupled to the diode element, wherein the diode element is forward biased from the match line to the first node.

11. The CAM cell of claim 10, wherein the match line has a signal swing equal to a transistor threshold voltage.

12. The CAM cell of claim 10, further comprising a sensor circuit coupled to the match line, the sensor circuit pre-charging the match line to a voltage less than the $V_{CC}$ supply voltage.

13. The CAM cell of claim 12, wherein the sensor circuit comprises a logic gate for providing an output signal that indicates whether a match or a no-match condition exists, the output signal having a signal swing equal to the $V_{CC}$ supply voltage.

14. The CAM cell of claim 1, further comprising a bit line control circuit for biasing the second set of bit lines.

15. The CAM cell of claim 14, wherein the bit line control circuit comprises a first transistor for coupling the second set of bit lines during a pre-charge operation.

16. The CAM cell of claim 14, wherein the bit control circuit comprises one or more transistors for coupling the second set of bit lines to a voltage supply line during a global masking operation, the voltage supply line having a voltage less than the $V_{CC}$ supply voltage.

17. The CAM cell of claim 14, wherein the bit line control circuit comprises a plurality of transistors for selectively coupling the second set of bit lines to a voltage supply line and a ground supply line, whereby the second set of bit lines receive voltages representative of the comparison data value from the voltage supply line and the ground supply line, the voltage supply line having a voltage less than the $V_{CC}$ supply voltage.

18. The CAM cell of claim 17, wherein the voltage supply line has a voltage of two times a transistor threshold voltage.

19. The CAM cell of claim 14, wherein the bit line control circuit is powered by a supply voltage less than the $V_{CC}$ supply voltage.

20. A content addressable memory (CAM) cell having a match line that carries a signal to indicate whether a match or a no-match condition exists within the CAM cell, wherein the difference between a voltage on the match line during the match condition and a voltage on the the match line during the no-match condition in equal to one transistor threshold voltage.

21. A method of operating a content addressable memory (CAM) cell that includes a static random access (SRAM) cell, the method comprising:

operating the SRAM cell in response to a $V_{CC}$ supply voltage, the SRAM cell storing a data value;

writing a data value to the SRAM cell on a first set of one or more bit lines, the first set of bit lines having a signal swing equal to the $V_{CC}$ supply voltage;

reading data values from the SRAM cell on the first set of bit lines;

controlling the signal swing on the first set of bit lines to be equal to the $V_{CC}$ supply voltage;

providing comparison data values to the CAM cell on a second set of bit lines; and controlling the signal swing on the second set of bit lines to be less than the $V_{CC}$ supply voltage.

22. The method of claim 21, further comprising the step of comparing the data value stored in the CAM cell with the comparison data value to determine whether a match condition or a no-match condition exists.

23. The method of claim 22, further comprising the step of indicating a match condition and a no-match audition by providing a signal having a signal swing equal to one transistor threshold voltage.

24. The method of claim 22, wherein the step of comparing comprises the step of coupling one of the bit lines in the second set of bit lines to a match line in response to the data value stored in the CAM cell.

25. The method of claim 24, further comprising the step of pre-charging the match line to a voltage less than the $V_{CC}$ supply voltage.

26. The method of claim 25, further comprising the step of discharging the match line when a no-match condition exists.

27. The method of claim 23, further comprising the step of converting the signal having the signal swing of one transistor threshold voltage to a signal having a signal swing equal to the $V_{CC}$ supply voltage.

28. The method of claim 21, further comprising the step of equalizing the second set of bit lines prior to providing the comparison data values to the CAM cell on the second set of bit lines.

29. The method of claim 21, further comprising the step of connecting the second set of bit lines to a voltages supply line during a global masking operation, the voltage supply line having a voltage less than the $V_{CC}$ supply voltage.

30. The method of claim 21, further comprising the step of selectively coupling the second set of bit lines to a voltage supply line and a ground supply line, whereby the second set of bit lines receive voltages representative of the comparison data value from the voltage supply line and the ground supply line, the voltage supply line having a voltage less than the $V_{CC}$ supply voltage.

31. The method of claim 30, wherein the voltage supply line has a voltage of two times a transistor threshold voltage.

32. The method of claim 21, further comprising the step of biasing the second set of bit lines with a supply voltage less than the $V_{CC}$ supply voltage.

*33. A method of operating a content addressable memory (CAM) array, comprising the steps of:*

*precharging first and second match sense lines that are electrically coupled to compare circuitry within a row of CAM cells to first and second positive voltage levels, respectively, said second voltage level having a maximum value that is less than Vcc, where Vcc is a power supply voltage supplied to the row of CAM cells;*

*applying a plurality of comparison data values to a plurality of comparison data lines that are electrically coupled to the row of CAM cells; and*

*detecting a match/no-match condition between the applied comparison data values and data stored in the row of CAM cells by sensing a voltage on the first match sense line in-sync with discharging the second match sense line from its precharged second positive voltage level.*

*34. The method of claim 33, wherein said detecting step comprises shorting the precharged first match sense line to the discharged second match sense line if a no-match condition is present between the applied comparison data values and the data stored in the row of CAM cells.*

*35. The method of claim 33, wherein the row of CAM cells is electrically coupled to a plurality of read/write bit lines; wherein said precharging step is preceded by the step of writing data into the row of CAM cells by driving at least some of the plurality of read/write bit lines at high logic*

*levels that are about equal to Vcc; and wherein said applying step comprises driving at least some of the comparison data lines at high logic levels that are lower than Vcc by an amount equal to at least a transistor threshold voltage.*

*36. A content addressable memory (CAM) array, comprising the steps of:*

*a plurality of pairs of comparison data lines;*

*a row of CAM cells having compare circuitry therein that is electrically coupled to said plurality of pairs of comparison data lines;*

*first and second match sense lines that are electrically coupled to the compare circuitry in said row of CAM cells; and*

*a sensor circuit that is configured to disable the compare circuitry from indicating a match/no-match condition on the first match sense line by precharging the first and second match sense lines to first and second positive voltage levels, respectively, and is further configured to enable the compare circuitry to indicate a match/no-match condition on the first match sense line by discharging the second match sense line from its precharged second positive voltage level, said second positive voltage level having a maximum value that is less than Vcc by at least a transistor threshold voltage, where Vcc is a power supply voltage supplied to said row of CAM cells.*

*37. The CAM array of claim 36, wherein said sensor circuit is further configured to detect a voltage on the first match sense line as representing the match/no-match condition, in response to discharging the second match sense line from its precharged second positive voltage level.*

*38. The CAM array of claim 37, wherein an output of said sensor circuit is electrically coupled to an encoder.*

*39. The CAM array of claim 37, wherein said sensor circuit is responsive to at least one clock signal.*

*40. The CAM array of claim 37, wherein in response to being enabled by said sensor circuit, the compare circuitry is configured to short the first match sense line to the discharged second match sense line if a no-match condition is present between data applied to said plurality of pairs of comparison data lines and data entry stored in said row of CAM cells.*

*41. The CAM array of claim 37, wherein the compare circuitry comprises a plurality of local masking transistors having first current carrying terminals electrically connected to the second match sense line.*

*42. The CAM array of claim 41, wherein said row of CAM cells comprises SRAM-based memory cells therein; and wherein the local masking transistors are responsive to local mask enable signals.*

*43. The CAM array of claim 42, further comprising a plurality of pairs of read/write bit lines electrically coupled to the SRAM-based memory cells in said row of CAM cells.*

*44. The CAM array of claim 37, wherein the compare circuitry comprises a plurality of local masking transistors having first current carrying terminals electrically connected to the first match sense line.*

*45. The CAM array of claim 44, wherein said row of CAM cells comprises SRAM-based memory cells therein; and wherein the local masking transistors are responsive to local mask enable signals.*

*46. The CAM array of claim 45, further comprising a plurality of pairs of read/write bit lines electrically coupled to the SRAM-based memory cells in said row of CAM cells.*

*47. The CAM array of claim 36, wherein the compare circuitry comprises a plurality of XOR gates that are each associated with a respective CAM cell in said row of CAM cells.*

*48. A method of operating a content addressable memory (CAM) cell, comprising the steps of:*

*precharging first and second match sense lines that are electrically coupled to a compare circuit within the CAM cell to first and second positive voltage levels, respectively, said second positive voltage level having a maximum value that is less than Vcc, where Vcc is a power supply voltage supplied to the CAM cell;*

*applying a comparison data value to a pair of comparison data lines that are electrically coupled to the CAM cell; and*

*comparing the applied comparison data value with a data value stored in the CAM cell by discharging the second match sense line from its precharged second positive voltage level to a discharged voltage level and then sensing whether the first match sense line is maintained at its precharged first positive voltage level or is pulled down to the discharged voltage level by the compare circuit.*

*49. The method of claim 48, wherein said precharging step is performed in-sync with a first edge to a first clock signal; and wherein said comparing step is performed in-sync with a second edge of the first clock signal.*

*50. The method of claim 48, wherein the first and second positive voltage levels are equal.*

*51. The method of claim 50, wherein said applying step comprises driving at least one of the pair of comparison data lines with a signal having a voltage swing that is less than Vcc.*

*52. The method of claim 48, wherein said comparing step comprises shorting the first match sense line to the discharged second match sense line in the event a no-match condition exists between the applied comparison data value and the data value stored in the CAM cell.*

*53. The CAM array of claim 36, further comprising:*

*a plurality of pairs of read/write bit lines that are electrically coupled to the CAM cells in said row of CAM cells; and*

*a bit line control circuit electrically coupled to said plurality of pairs of comparison data lines and said plurality of pairs of read/write bit lines, said bit line control circuit configured to support signal swings on said plurality of pairs of comparison data lines that are less than signal swings on said plurality of pairs of read/write bit lines.*

*54. The CAM array of claim 53, wherein the signal swings on said plurality of pairs of read/write bit lines are equal to about Vcc.*

*55. A CAM array, comprising:*

*a CAM cell having a memory cell therein that is powered at a supply voltage;*

*a pair of read/write bit lines electrically coupled to said CAM cell;*

*a pair of comparison data lines electrically coupled to said CAM cell; and*

*a bit line control circuit electrically coupled to said pair of read/write bit lines and said pair of comparison bit lines, said bit line control circuit configured to support a signal swing on said pair of comparison bit lines that is less than a signal swing on said pair of read/write bit lines.*

*56. A CAM cell, comprising:*

*a memory cell electrically coupled to a pair of read/write bit lines; and*

*a data comparison circuit electrically coupled to a pair of comparison bit lines, a match line and said memory*

*cell, said data comparison circuit configured to indicate a mismatch between data stored in said memory cell and data applied to the pair of comparison bit lines during a comparison operation, by transferring charge between the match line and at least one of the pair of comparison bit lines.*

*57. The CAM cell of claim 56, wherein said data comparison circuit comprises a pair of N-channel transistors that are electrically connected in series between the pair of comparison bit lines.*

*58. The CAM cell of claim 57, wherein gate terminals of the pair of N-channel transistors are electrically coupled to said memory cell.*

*59. The CAM cell of claim 58, wherein the pair of N-channel transistors are joined together at a node; and wherein said data comparison circuit further comprises a first transistor having first current carrying terminal electrically coupled to the node.*

*60. The CAM cell of claim 59, wherein said data comparison circuit further comprises a local masking transistor having a first current carrying terminal electrically connected to the first transistor and a second current carrying terminal electrically connected to the match line.*

*61. A CAM array, comprising:*

*a first CAM cell comprising a first memory cell electrically coupled to a first pair of read/write bit lines, and a first data comparison circuit electrically coupled to a first pair of comparison bit lines, a match line and said first memory cell, said first data comparison circuit configured to indicate a mismatch between data stored in said first memory cell and data applied to the first pair of comparison bit lines during a comparison operation, by transferring charge between the match line and at least one of the first pair of comparison bit lines; and*

*a second CAM cell comprising a second memory cell electrically coupled to a second pair of read/write bit lines, and a second data comparison circuit electrically coupled to a second pair of comparison bit lines, the match line and said second memory cell, said second data comparison circuit configured to indicate a mismatch between data stored in said second memory cell and data applied to the second pair of comparison bit lines during the comparison operation, by transferring charge between the match line and at least one of the second pair of comparison bit lines.*

*62. The CAM array of claim 61, wherein the first data comparison circuit comprises a first pair of N-channel transistors that are electrically connected in series between the first pair of comparison bit lines; and wherein the second data comparison circuit comprises a second pair of N-channel transistors that are electrically connected in series between the second pair of comparison bit lines.*

*63. The CAM array of claim 62, wherein gate terminals of the first pair of N-channel transistors are electrically coupled to the first memory cell.*

*64. The CAM array of claim 62, wherein the first pair of N-channel transistors are joined together at a first node; and wherein the first data comparison circuit further comprises a first transistor having a first current carrying terminal electrically coupled to the first node.*

*65. The CAM array of claim 64, wherein the second pair of N-channel transistors are joined together at a second node; and wherein the second data comparison circuit further comprises a second transistor having a first current carrying terminal electrically coupled to the second node.*

*66. The CAM array of claim 65, further comprising a sensor circuit having an output that is electrically coupled to gate terminals of the first and second transistors.*

*67. The CAM array of claim 64, wherein said first data comparison circuit further comprises a local masking transistor having a first current carrying terminal electrically connected to the first transistor and a second current carrying terminal electrically connected to the match line.*

*68. A CAM cell, comprising:*

*a memory cell electrically coupled to a pair of read/write bit lines; and*

*a data comparison circuit electrically coupled to a pair of comparison bit lines, a match line and said memory cell, said data comparison circuit configured to indicate a mismatch between data stored in said memory cell and data applied to the pair of comparison bit lines during a comparison operation, by sinking current from the match line to at least one of the pair of comparison bit lines.*

* * * * *

UNITED STATES PATENT AND TRADEMARK OFFICE

CERTIFICATE OF CORRECTION

PATENT NO. : RE 39,227 E
APPLICATION NO. : 10/403581
DATED : August 8, 2006
INVENTOR(S) : Chuen-Der Lien It is certified that error appears in the above-identified patent and that said Letters Patent is hereby corrected as shown below:

Column 16, line 46
Change "second voltage level" to --second positive voltage level --.

Signed and Sealed this

Seventh Day of November, 2006

JON W. DUDAS
*Director of the United States Patent and Trademark Office*